United States Patent [19]
Novosel et al.

[11] Patent Number: 5,661,664
[45] Date of Patent: Aug. 26, 1997

[54] ONE-TERMINAL DATA FAULT LOCATION SYSTEM AND PROCESS FOR LOCATING A FAULT

[75] Inventors: Damir Novosel, Cary, N.C.; Arun G. Phadke, Blacksburg, Va.

[73] Assignee: ABB Power T&D Company Inc., Raleigh, N.C.

[21] Appl. No.: 515,274

[22] Filed: Aug. 15, 1995

Related U.S. Application Data

[63] Continuation of Ser. No. 203,710, Feb. 28, 1994, abandoned.

[51] Int. Cl.[6] ................................................. G01R 31/08
[52] U.S. Cl. ........................... 364/492; 364/481; 364/482; 364/487; 324/512; 324/525; 361/80
[58] Field of Search .................................... 364/480–481, 364/483, 492–495, 482, 487; 324/509, 523, 520–522, 539, 512, 525; 361/80, 93, 79, 88; 340/662

[56] References Cited

U.S. PATENT DOCUMENTS

| | | | |
|---|---|---|---|
| 3,590,368 | 6/1971 | Esclangon | 324/51 |
| 4,092,690 | 5/1978 | Wilkinson | 361/80 |
| 4,107,778 | 8/1978 | Nii et al. | 364/492 |
| 4,128,805 | 12/1978 | Lanz | 324/52 |
| 4,281,386 | 7/1981 | Kondow et al. | 364/492 |

(List continued on next page.)

OTHER PUBLICATIONS

T. Takagi et al., "Development of a new type fault locator uning the one terminal voltage and current data" IEEE Transactions on Power apparatus and Systems, vol. PAS–101, No. 8 Aug. 1982.

M. S. Sachdev et al., "A technique for estimating transmission line fault locations from digital impedance relay measurements" IEEE Transactions on Power Delivery, vol. 3, No. 1 Jan. 1988.

(List continued on next page.)

*Primary Examiner*—Emanuel T. Voeltz
*Assistant Examiner*—Cuong H. Nguyen
*Attorney, Agent, or Firm*—Woodcock Washburn Kurtz Mackiewicz & Norris LLP

[57] ABSTRACT

A one-terminal process for locating a fault associated with a transmission system is disclosed. The process is based on the principle fault sequence can be determined by a distribution factor in positive faults may be any defect among phases or ground. The process begins by one end of a transmission line. If the data is oscillographic data, measured data is in phasor form, or after phasors have been calculated determined. Thereafter, a decision is made whether the pre-fault data data is sound, an equation is selected to calculate the fault location decision is made whether the phase is a three-phase fault. Then, a employed to compensate for the fault through a resistance by measuring part of the apparent line impedance. If the fault is not a three-phase formula is not employed and the appropriate equation is selected for the fault location parameter. Accurate fault location techniques for also disclose. The system is insensitive to the zero sequence current information about the system source impedances is required.

23 Claims, 7 Drawing Sheets

U.S. PATENT DOCUMENTS

| | | | |
|---|---|---|---|
| 4,313,169 | 1/1982 | Takagi et al. | 364/492 |
| 4,314,199 | 2/1982 | Yamaura et al. | 324/52 |
| 4,352,137 | 9/1982 | Johns | 361/82 |
| 4,371,908 | 2/1983 | Andow et al. | 361/83 |
| 4,390,835 | 6/1983 | Elkateb et al. | 324/51 |
| 4,405,966 | 9/1983 | Cavero | 361/80 |
| 4,455,612 | 6/1984 | Girgis et al. | 364/483 |
| 4,499,417 | 2/1985 | Wright et al. | 324/52 |
| 4,559,491 | 12/1985 | Saha | 324/52 |
| 4,570,231 | 2/1986 | Bunch | 364/492 |
| 4,689,709 | 8/1987 | Isahaya | 361/80 |
| 4,755,903 | 7/1988 | Kotani | 361/80 |
| 4,766,549 | 8/1988 | Schweitzer et al. | 364/481 |
| 4,795,983 | 1/1989 | Crockett et al. | 324/521 |
| 4,797,805 | 1/1989 | Nimmersjo | 364/481 |
| 4,803,635 | 2/1989 | Andow | 364/483 |
| 4,811,154 | 3/1989 | Trenkler et al. | 361/93 |
| 4,812,995 | 3/1989 | Girgis et al. | 364/481 |
| 4,851,782 | 7/1989 | Jeerings et al. | 324/520 |
| 4,857,854 | 8/1989 | Matsushima | 324/512 |
| 4,868,704 | 9/1989 | Cavero | 361/80 |
| 4,871,971 | 10/1989 | Jeerings et al. | 324/509 |
| 4,897,607 | 1/1990 | Grunewald et al. | 324/512 |
| 4,906,937 | 3/1990 | Wikstrom et al. | 324/522 |
| 4,996,624 | 2/1991 | Schweitzer, III | 361/63 |
| 4,998,098 | 3/1991 | Schweitzer, III | 340/662 |
| 5,072,403 | 12/1991 | Johns | 364/492 |
| 5,181,026 | 1/1993 | Granville | 340/870.28 |

OTHER PUBLICATIONS

A. Girgis et al., "A new fault location technique for two and three terminal lines" IEEE Transactions on Power Delivery, vol. 7, No. 1 Jan. 1992.

Novosel et al., "Improvements in Fault Location Estimate," pp. 1–8, Apr. 1993.

T. Takagi et al., "Development of a New Type Fault Locator Using the One–Terminal voltage and Current Data," IEEE Transctions on Power Apparatus and Systems, vol. PAS–101, No. 8, Aug. 1982.

Muchuan Michael Chen, "Managerial Relaying: An Adaptive Approach To A System Protection Problem," Ph.D. Dissertation, University of Pennsylvania, 1974.

M.S. Sachdev, et al., "A Tehcnique For Estimating Transmission Line Fault Locations From Digital Impedance Relay Measurements," IEEE Transactions on Power Delivery, vol. 3, No. 1, Jan. 1988.

A. Girgis, et al., "A New Fault Location Technique For Two– And Three–Terminal Lines," IEEE Transactions on Powre Delivery, vol. 7, No. 1, Jan. 1992.

D. Novosel et al., "Accurate Fault Location Using Digital Relays," 1 CPST '94, Oct. 18–21, 1994, Beijing, China.

NORMAL BALANCED
CONDITIONS

NOTE:
AT THE FAULT
$V_{ab} = V_{bc} = V_{ca} = 0$

THREE PHASE FAULT

NOTE:
AT THE FAULT $V_{bc} = 0$

PHASE "b"-TO-PHASE "c"
FAULT

NOTE:
AT THE FAULT
$V_{bc} = V_{bg} = V_{cg} = 0$

PHASE "b" TO-PHASE-
"c"-TO-GROUND FAULT

PHASE "a" TO-GROUND FAULT

NOTE:
AT THE FAULT $V_{ag} = 0$

Fig. 4B  Fig. 4C

ONE-TERMINAL DATA FAULT LOCATION SYSTEM AND PROCESS FOR LOCATING A FAULT

RELATED APPLICATIONS

This application is a continuation of application Ser. No. 08/203,710, filed Feb. 28, 1994 now abandoned.

FIELD OF THE INVENTION

The present invention relates generally to the field of protective relaying. More particularly, the invention relates to a system for automatically locating faults on an electrical transmission, subtransmission, or radial line by processing voltage and current phasors measured at a single end of the line.

BACKGROUND OF THE INVENTION

Protective relaying generally involves the performance of one or more of the following functions in connection with a protected power or energy system: (a) monitoring the system to ascertain whether it is in a normal or abnormal state; (b) metering, which involves measuring certain electrical quantities; (c) protection, which typically involves tripping a circuit breaker in response to the detection of a short-circuit condition; and (d) alarming, which provides a warning of some impending problem. Fault location is associated with the protection function. It involves measuring critical system parameters and, when a fault occurs, making an estimate of the fault location so that the faulted line can be returned to service as quickly as possible.

The phasor diagrams in FIGS. 1A–1E illustrate the effect of faults on the system voltages and currents. The diagrams are for effectively grounded systems, wherein the neutral is solidly grounded, and for the ideal case of a zero fault resistance ($R_F=0$). However, they are illustrative of the effects of faults on other types of systems, e.g., ungrounded and impedance grounded systems. In the diagrams, the dotted, uncollapsed voltage triangle exists in the source (the generator) and the maximum collapse is at the fault location. The voltages between the source and fault will vary between these extremes. The diagrams depict the effects of various types of faults on the currents and voltages (represented by phasors) in the system. FIG. 1A depicts the phasors for normal, balanced conditions; FIG. 1B depicts the phasors for a three-phase fault ($V_{ab}=V_{bc}=V_{ca}=0$ at the fault); FIG. 1C depicts the phasors for a phase b-to-phase c fault ($V_{bc}=0$ at the fault); FIG. 1D depicts the phasors for a phase b-to-phase c-to-ground fault ($V_{bc}=V_{bg}=V_{cg}=0$ at the fault); and FIG. 1E depicts the phasors for a phase a-to-ground fault ($V_{ag}=0$ at the fault).

An accurate estimate of the fault location is important to the utilities, particularly in bad weather and/or rough terrain, to avoid a cumbersome search and delays in line restoration. Accuracy is particularly important for long lines because with long lines a large percentage error in the fault location estimate represents a considerable distance. Furthermore, the fault condition may be temporary, due to fault clearing and/or a change in weather conditions, and not readily visible. In successful reclosing, accurate fault location information may be necessary to locate weak spots on the line and to speed the analysis of the disturbance.

Fault location systems may be classified as two-terminal data systems or one-terminal data systems. With two-terminal data systems, voltages and currents are measured at opposite ends of the protected line(s). These systems typically are more accurate than one-terminal data systems. However, two-terminal systems have a disadvantage in that communication between the respective terminals is required. Since end-to-end communication is not always available and can be interrupted, the requirement for data from two ends of the protected line represents a disadvantage of two-terminal data systems. With one-terminal data systems, only local voltages and currents are required. End-to-end communication is not required. However, in known systems, this advantage is offset by a requirement for knowledge of the source impedance to compensate for errors introduced by the fault resistance. Since source impedance may change due to changes in network configuration, source impedance values are typically unavailable.

In one known one-terminal data system, certain initial values, both for the argument difference and the fault distance, are assumed, and the current and voltage at the fault point are determined. If these two quantities are not in phase, new values of the argument difference and the fault distance are assumed. This procedure is repeated until the calculated fault current and the fault voltage are in phase. The last calculated value of the fault distance is assumed to be the correct value. However, small changes in the assumed value of the argument difference result in great changes of the calculated fault distance. Therefore, this system in many cases provides completely incorrect values or fails to converge toward a definite fault distance.

Another known system for locating faults with respect to a single monitoring point examines the time taken for a disturbance to travel from the monitoring point to the fault and back to the monitoring point after reflection at the fault point. A problem which could arise with this system is that the reflected disturbance could be confused with other disturbances arriving at the monitoring point as a result of reflections from other points in the transmission system. This could result in the protected section of the system being unnecessarily removed from service, when the fault is outside the protected section.

U.S. Pat. No. 4,559,491, Dec. 17, 1985, "Method and Device for Locating a Fault Point On a Three-Phase Power Transmission Line," discloses a method whereby currents and voltages are measured at a measuring point arranged at one end of a section of a three-phase transmission line. FIG. 2 is a one-line schematic diagram of the disclosed system of the U.S. Pat. No. 4,559,491 and is the same as FIG. 1 of the U.S. Pat. No. 4,559,491. The transmission line section under consideration has a length DL between its end points A and B. A fault locator FL is arranged adjacent to the end point A and is connected to the line via voltage and current transformers 1, 2 that feed measuring signals u and i to the fault locator.

An embodiment of the fault locator FL is shown in a schematic block diagram form in FIG. 8 of the 4,559,491 and FIG. 8 is reproduced in the present application as FIG. 2A. The fault locator FL includes a central processing unit CPU which carries out the following functions: collection of measured values; processing of measured values; calculation of the fault distance; outputting of result of the calculation; and, a return to normal measurement conditions after the line fault has been removed. The microprocessor MP comprises a data memory DM as well as a programming memory PM. The fault locator FL shown in FIG. 2A further comprises parameter setting member PAR for setting the complex values of the line parameters (e.g., $Z_L$, $Z_{OL}$, $Z_A$ and $Z_B$). Finally, there is a presentation unit DIS, for example, a light-emitting diode display and a printer PRI. A complete description of the mode of operation of the fault locator FL can be had by reference to column 10 beginning in line 42 and the following portions of the U.S. Pat. No. 4,559,491 which describe FIG. 9 and FIG. 10 of that patent; FIG. 9 being an explanatory diagram of the working procedure of the microprocessor in a fault locator, and FIG. 10 being in more detail in the form of a flow chart, the mode of operation of the fault locator.

Referring again to FIG. 2, the signals u and i are proportional to the voltages and currents at the point A. The line section has an impedance $Z_L$. A fault of arbitrary type is assumed to have occurred at a point F at the distance DF from the end point A. If n=DF/DL, the line impedance between the points A and F is $n \times Z_L$ and between the points F and B the line impedance is $(1-n) \times Z_L$. The network located "behind" end point A has a source voltage $E_A$ and an impedance $Z_A$. The network located "ahead of" the end point B has a source voltage $E_B$ and an impedance $Z_B$. It is assumed that $Z_L$ is a known parameter. The patent discloses that $Z_A$ may be known or may be calculated from measured values of currents and voltages taken at the end point A before and after a fault, and that $Z_B$ may be known but, if not, should be determinable with an acceptable degree of accuracy so that its value can be set in the fault locator FL.

When a fault occurs, the fault locator estimates the unknown distance DF (or the ratio n which gives the relative distance) from measured values of currents and voltages at the end point A before and after the fault and from pre-set or calculated values of the parameters $Z_A$, $Z_B$, $Z_L$. To estimate the fault location, the system determines the fault type and the measured currents and voltages are filtered for formation of their fundamental frequency components. Guided by the fault type and the complex values of the fundamental frequency components of the measured values, the impedance of the line section and the pre-set or calculated values of the impedances of the networks lying ahead of and behind the fault distance (n) are determined as the solution of the quadratic equation $$n^2 + B \times n + C = 0,$$

where n is the fault distance and B and C are dependent on the impedances and the fundamental frequency components of the measured values. (In the below description of the present invention, the fault location parameter is referred to as "m"). A shortcoming of this technique is that values of source impedance $Z_A$ and $Z_B$ are needed if the error introduced by fault resistance is to be fully compensated. (In the description of the present invention, the source impedances $Z_A$, $Z_B$ are referred to as $Z_S$ and $Z_R$). Source impedances change due to the changes in network configuration and information about their values is not readily available. A change in network configuration will degrade the accuracy of this technique.

U.S. Pat. No. 4,996,624, Feb. 26, 1991, "Fault Location Method for Radial Transmission and Distribution Systems," discloses a system for locating phase-to-ground faults in radial transmission and distribution lines with tapped loads, where the load currents are significant. The system measures the phase-to-ground voltage of the faulted line and the zero-sequence component of the fault current. The residual current (IR) is determined, and that current and a residual current compensation factor (k) are used to determine the positive-sequence impedance by dividing the phase-to-ground voltage by $IR \times (1+k)$. The distance to the fault is then determined by dividing the positive-sequence reactance by the total reactance of the faulted line and multiplying that value by the total line length. One shortcoming of this system is that it is limited to phase-to-ground faults and will not locate three-phase faults, phase-to-phase faults, and phase-to-phase-to-ground faults.

Accordingly, there is a need for an accurate one-terminal data fault location system that offers advantages over the prior art. The present invention provides such a system.

SUMMARY OF THE INVENTION

The present invention provides a fault location system and process for accurately locating a fault associated with one or more conductors of an electric power transmission or distribution system. The fault may be one of the following fault types: phase-to-ground, phase-to-phase-to-ground, phase-to-phase, and phase-to-phase-to-phase. The system disclosed herein is useful in automatically estimating the location of faults in transmission, subtransmission, and radial lines. Preferred embodiments of the system use oscillographic and/or phasor data from microprocessor relays. It will be understood by those skilled in the art that the microprocessor relays could also be utilized to process such data in accordance with the process or processes of the present invention.

An important idea underlying the present invention is that the current in a fault can be determined by a positive or negative distribution factor. Thus, in accordance with the present invention, it is only necessary to determine the positive or negative sequence current in the fault. The inventive system is insensitive to the zero sequence current distribution factor. Moreover, no information about the system source impedances is required.

The inventive process comprises the steps of obtaining a voltage phasor ($V_{Af}$) and a current phasor ($I_{sf}$), the voltage phasor being indicative of an amplitude and phase associated with a voltage waveform at a first prescribed location and the current phasor being indicative of an amplitude and phase associated with a current waveform at the first prescribed location; determining the fault type; and generating a fault location parameter m indicative of the location of the fault. According to the invention, the fault location parameter is generated on the basis of at least one of the following equations:

(1) for a phase-to-ground fault, $$m = \frac{\dfrac{Re(V_{Afa})}{Re(I_{sf2})} - \dfrac{Im(V_{Afa})}{Im(I_{sf2})}}{R_{l1} * \left[ \dfrac{Re(I^F_{sfa})}{Re(I_{sf2})} - \dfrac{Im(I^F_{sfa})}{Im(I_{sf2})} \right] - X_{l1} * \left[ \dfrac{Re(I^F_{sfa})}{Im(I_{sf2})} + \dfrac{Im(I^F_{sfa})}{Re(I_{sf2})} \right]}$$

or $$m = \frac{\dfrac{Re(V_{Afa})}{Re(\Delta I_{s1})} - \dfrac{Im(V_{Afa})}{Im(\Delta I_{s1})}}{R_{l1} * \left[ \dfrac{Re(I^F_{sfa})}{Re(\Delta I_{s1})} - \dfrac{Im(I^F_{sfa})}{Im(\Delta I_{s1})} \right] - X_{l1} * \left[ \dfrac{Re(I^F_{sfa})}{Im(\Delta I_{s1})} + \dfrac{Im(I^F_{sfa})}{Re(\Delta I_{s1})} \right]}$$

wherein $V_{Afa}$, $I_{sf2}$, $I^F_{sfa}$, $R_{l1}$, $X_{l1}$, and $\Delta I_{s1}$ are described below;

(2) for a phase-to-phase-to-ground fault, $$m = \frac{\dfrac{Re(V_{Afbc})}{Re(\Delta I_{sbc})} - \dfrac{Im(V_{Afbc})}{Im(\Delta I_{sbc})}}{R_{l1} * \left[\dfrac{Re(I_{sfbc})}{Re(\Delta I_{sbc})} - \dfrac{Im(I_{sfbc})}{Im(\Delta I_{sbc})}\right] - X_{l1} * \left[\dfrac{Re(I_{sfbc})}{Im(\Delta I_{sbc})} + \dfrac{Im(I_{sfbc})}{Re(\Delta I_{sbc})}\right]}$$

wherein $V_{Afbc}$, $I_{sfbc}$, and $\Delta I_{sbc}$ are described below;

(3) for a phase-to-phase fault, $$m = \frac{\dfrac{Re(V_{Afbc})}{-Im(I_{sf2})} - \dfrac{Im(V_{Afbc})}{Re(I_{sf2})}}{R_{l1} * \left[\dfrac{Re(I_{sfbc})}{-Im(I_{sf2})} - \dfrac{Im(I_{sfbc})}{Re(I_{sf2})}\right] - X_{l1} * \left[\dfrac{Re(I_{sfbc})}{Re(I_{sf2})} + \dfrac{Im(I_{sfbc})}{-Im(I_{sf2})}\right]};$$

(4) for a phase-to-phase-to-phase fault, $$m = \frac{\dfrac{Re(V_{Afa})}{re(\Delta I_{sa})} - \dfrac{Im(V_{Afa})}{Im(\Delta I_{sa})}}{R_{l1} * \left[\dfrac{Re(I_{sfa})}{Re(\Delta I_{sa})} - \dfrac{Im(I_{sfa})}{Im(\Delta I_{sa})}\right] - X_{l1} * \left[\dfrac{Re(I_{sfa})}{Im(\Delta I_{sa})} + \dfrac{Im(I_{sfa})}{Re(\Delta I_{sa})}\right]}$$

wherein $I_{sfa}$ and $\Delta I_{sa}$ are described below.

Advantages of the disclosed system include the following:

(1) It requires voltages and currents from only one end of the line.

(2) It compensates for the influence of fault resistance, load flow, and reactance-over-resistance (X/R) ratio in the system.

(3) Zero sequence current distribution factors (single line and parallel lines) do not influence the accuracy of the fault location estimation.

(4) It does not require knowledge of source impedance.

(5) In association with long lines, distributed parameter models of the line may be used to improve the accuracy of the fault location estimation.

(6) In association with radial lines and where additional information is communicated, fault location accuracy may be improved by modifying the basic technique as disclosed herein.

BRIEF DESCRIPTION OF THE DRAWINGS

FIGS. 4B and 4C depict Thevenin equivalents of the section of the system behind the local and remote terminals. FIG. 4B represents the pre-fault system and FIG. 4C represents the superimposed system.

DETAILED DESCRIPTION OF PREFERRED EMBODIMENTS

The present invention provides a system (methods and apparatus) for estimating a fault location parameter that is indicative of the location of the fault. In preferred embodiments of the invention, voltage and current phasors from one terminal of a protected line are required. However, it is not necessary that these phasors be provided by a protective relay per se, as they could be computed in a separate processor which, of course, could also be used to process such phasors in accordance with the process or processes of the present invention. The process or processes in accordance with the invention may be implemented as part of a fault-location software package for use with a protective relaying system. It will be understood to those skilled in the art that such a protective relaying system includes microprocessor relays which can be constructed and arranged to process the above-mentioned phasors/data in accordance with the process or processes of the present invention.

Figure 3A:
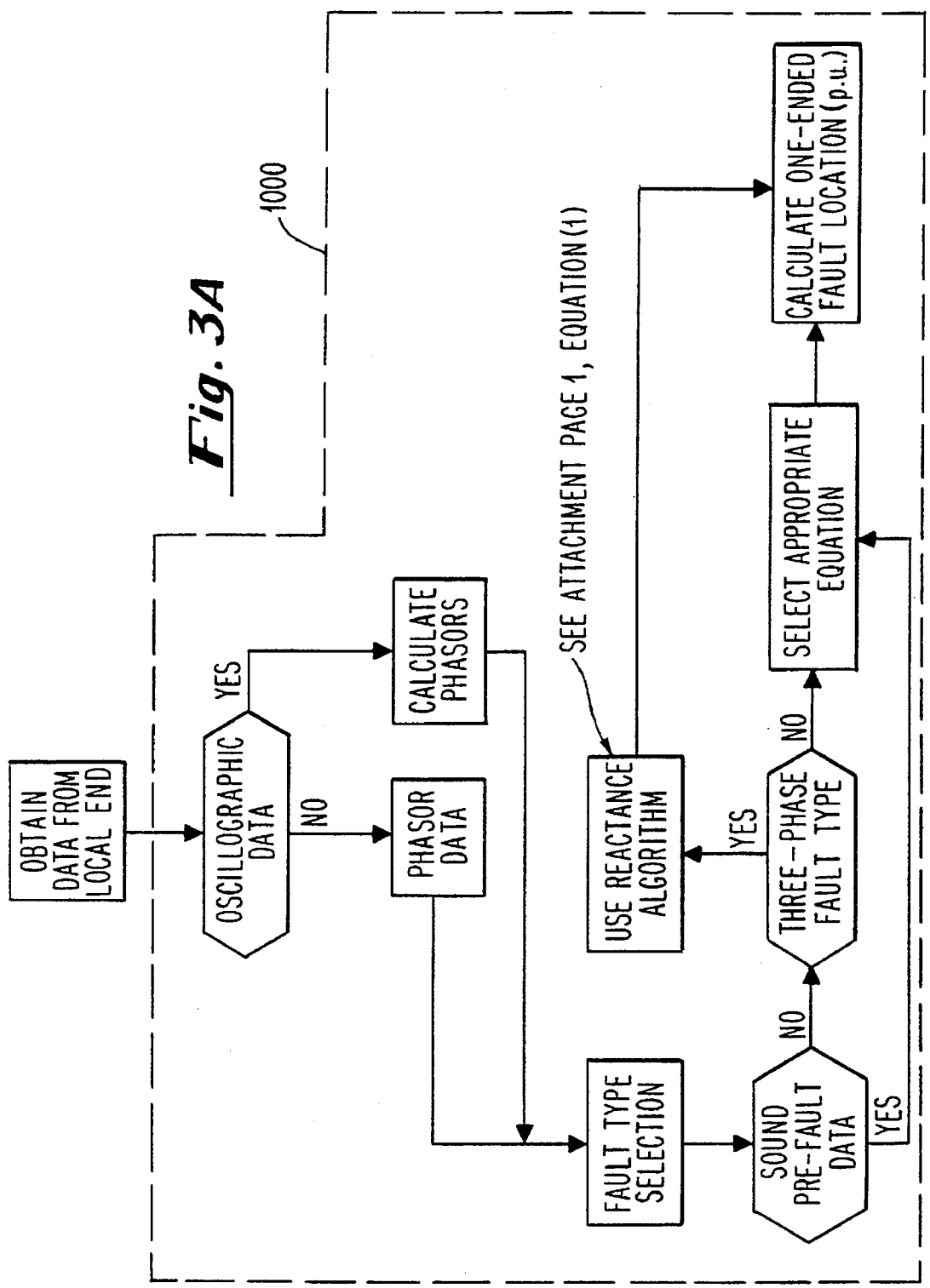
FIGS. 3A, 3B, and 3C are block diagrams representing "fault locator means" or the "means for generating a fault location parameter m indicative of the location of the fault" in accordance with the invention. Located within each of blocks 1000 illustrating the "fault locator means" or the "means for generating a fault location parameter m indicative of the location of the fault" are flowcharts of embodiments of fault location processes in accordance with the present invention. Within block 1000 of FIG. 3A is a flowchart of a basic process for determining a fault location parameter "m"; within block 1000 of FIG. 3B is a flowchart of a variation of the basic process including compensation for long lines; within block 1000 of FIG. 3C is a flowchart of a variation for use with radial lines.
Figure 3B:
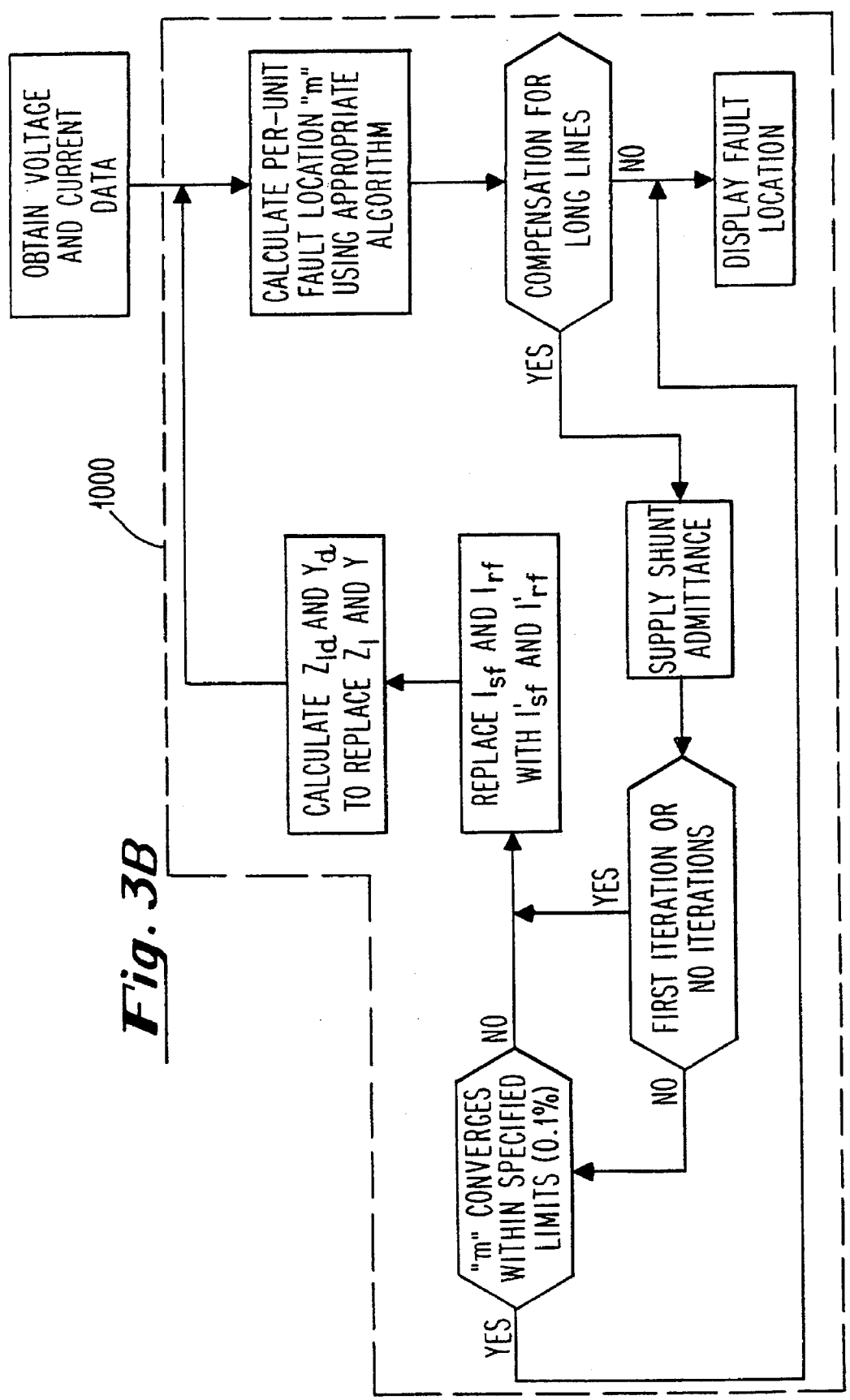
Figure 3C:
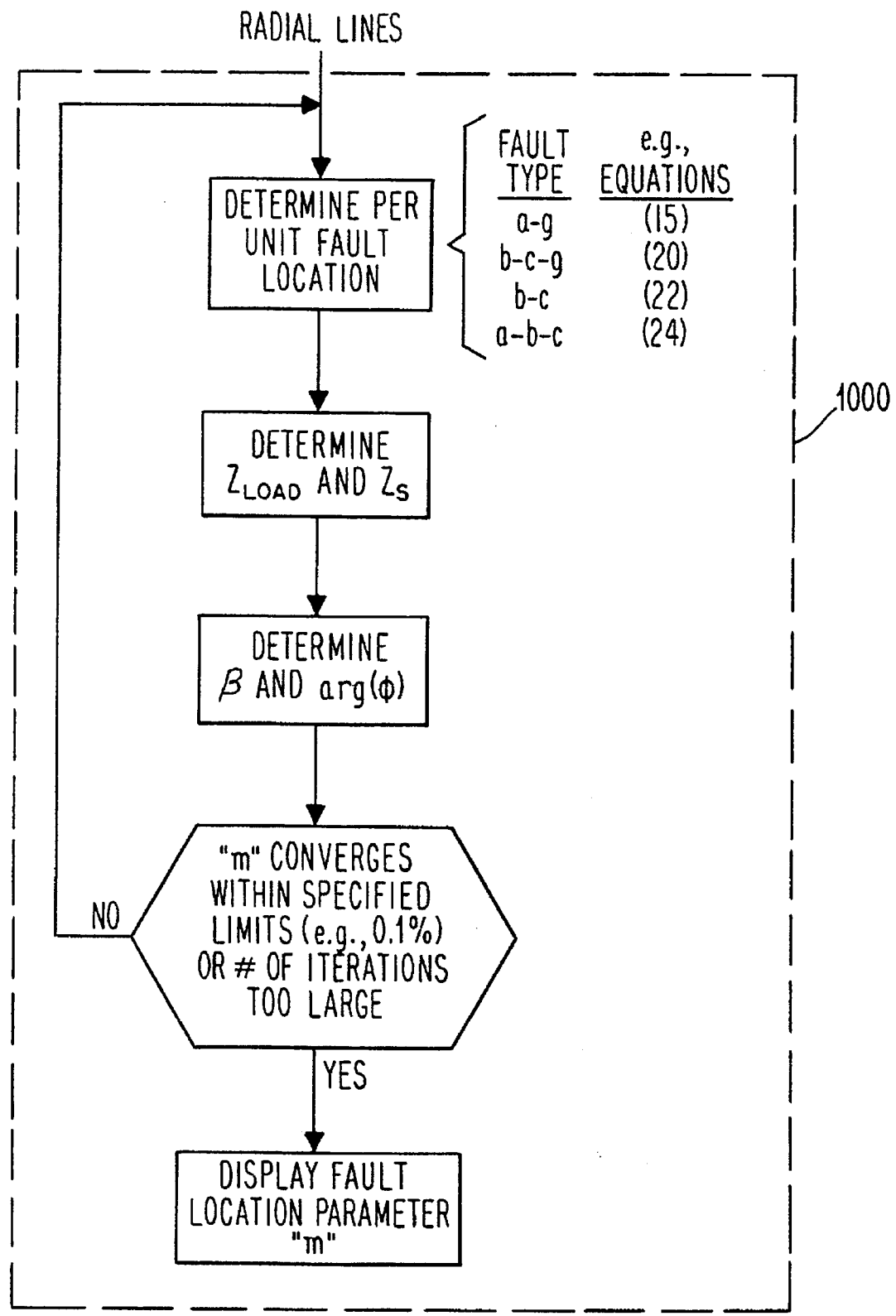

The inventive fault location system is outlined next with reference to FIGS. 3A–3C. A more detailed derivation of the system is provided after this outline. Throughout the several Figures of the drawings like reference numerals refer to like parts or structure.

Figure 1A:
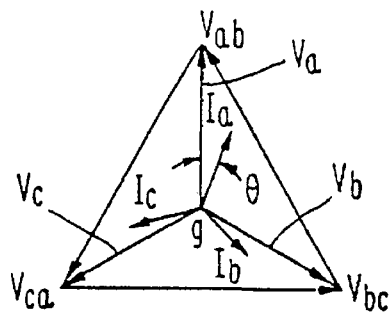
FIGS. 1A–1E are phasor diagrams depicting the effects of various types of solid faults on the currents and voltages of a typical power system.
Figure 1B:
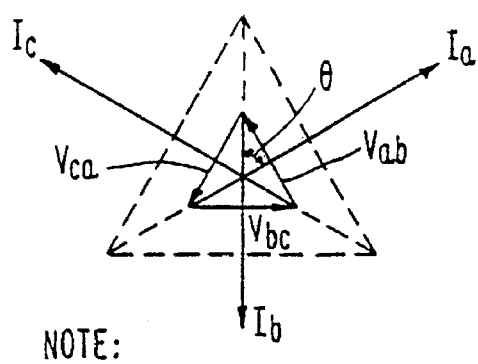
Figure 1C:
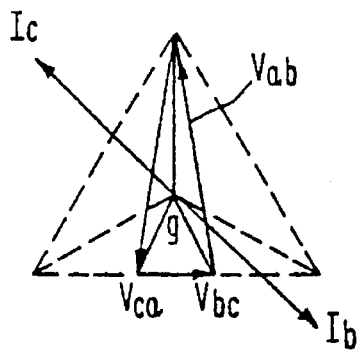
Figure 1D:
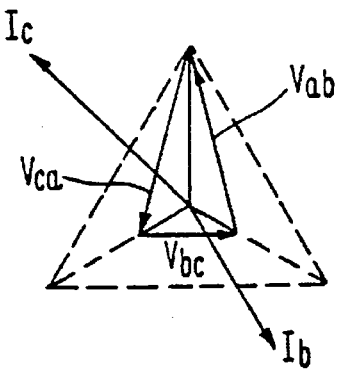
Figure 1E:
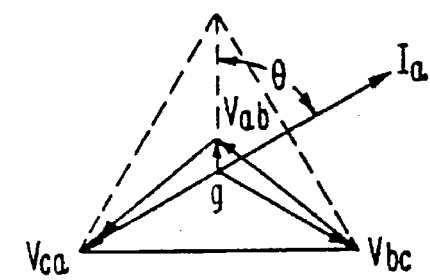
Figure 2:
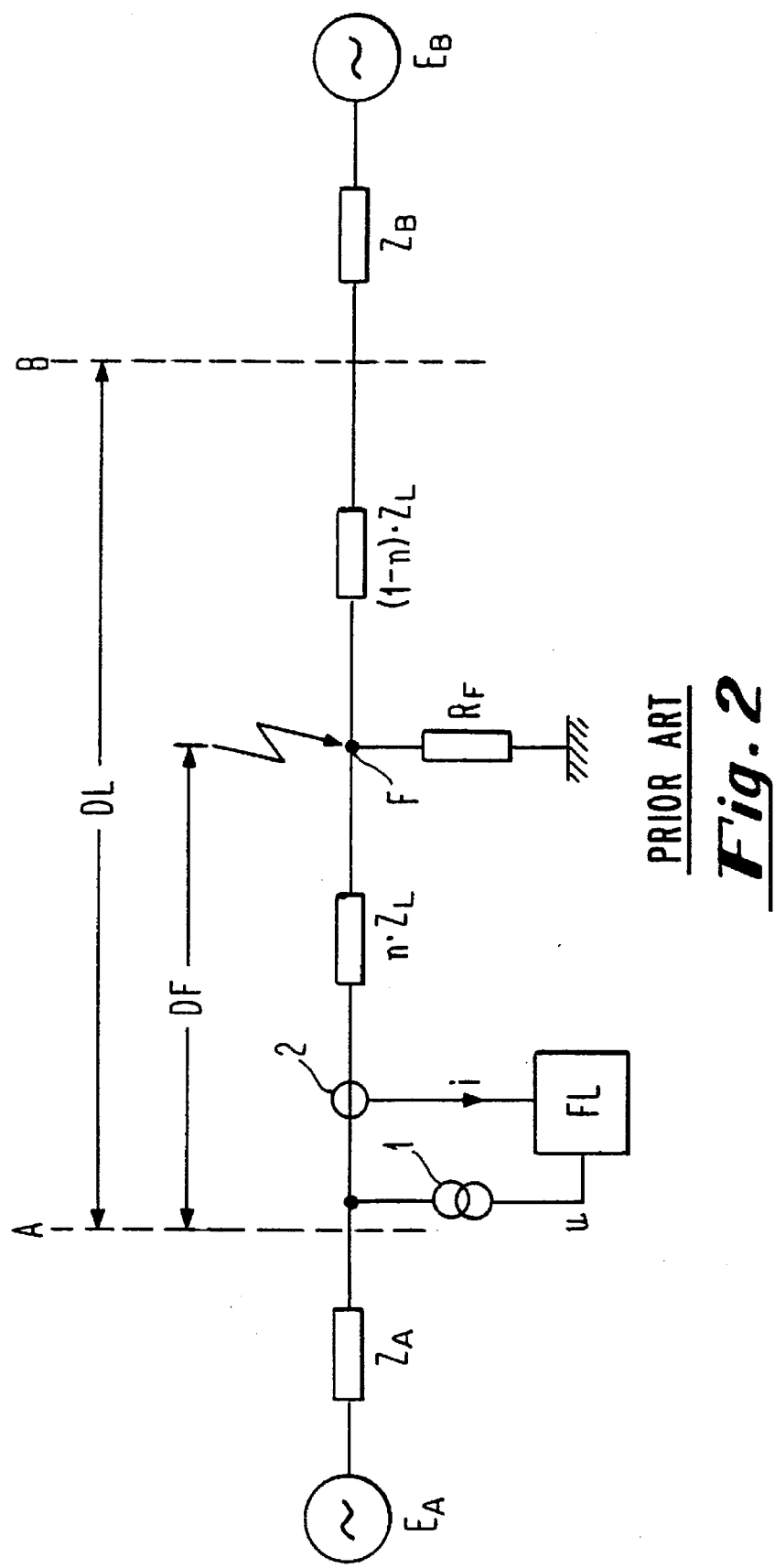
FIGS. 2 and 2A are schematic diagrams referred to above in explaining one prior art fault location system.
Figure 2A:
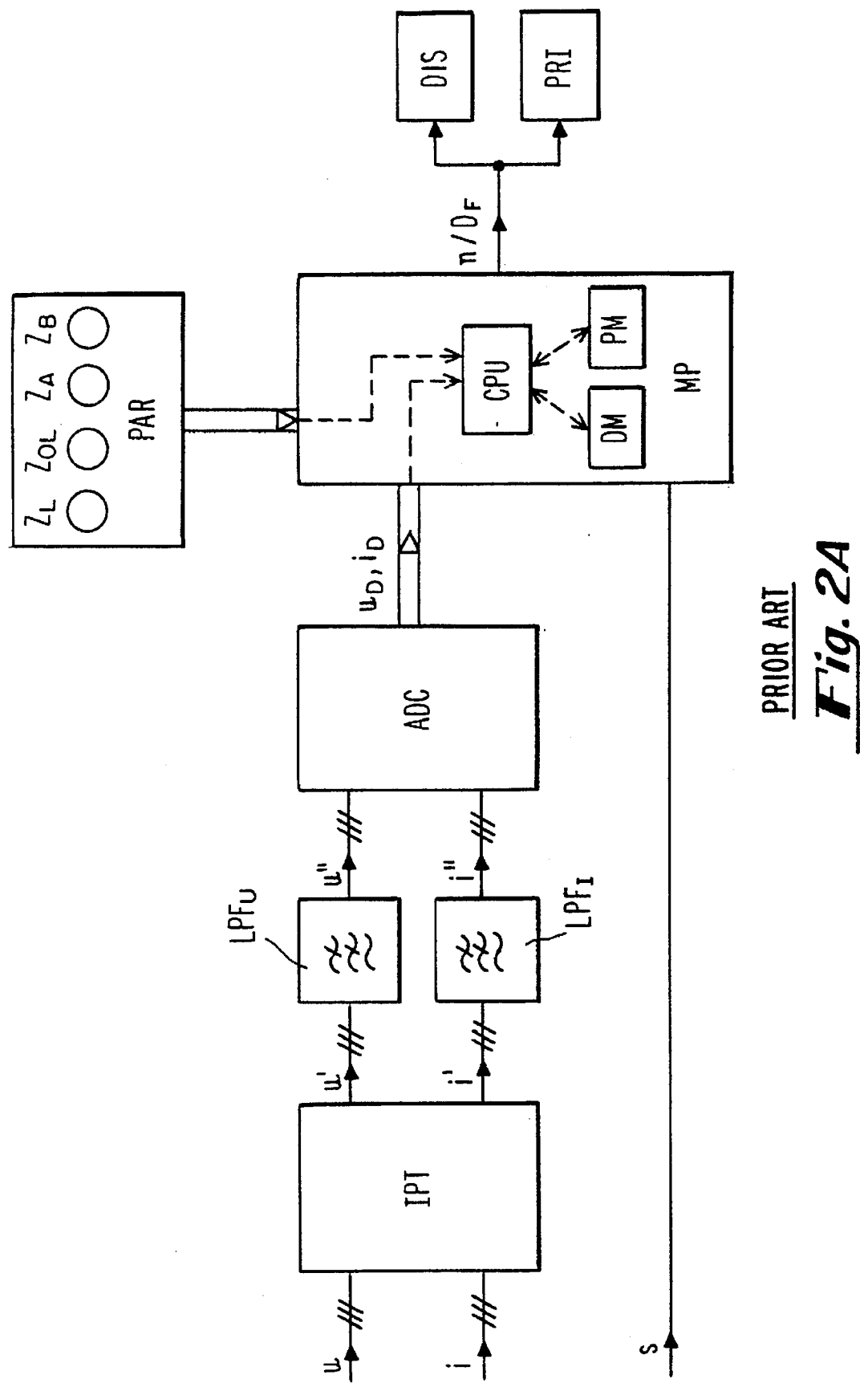

FIG. 3A, at block 1000, is a diagrammatic representation of "fault locator means" or "means for generating a fault location parameter m indicative of the location of the fault" (as referred to in the claims hereof) in accordance with the invention and within block 1000 is a flowchart of a basic fault location process in accordance with the present invention. It will be well understood by those skilled in the art more fully hereinafter as the description of the present invention proceeds that block 1000 and the various labeled blocks within block 1000 can be implemented by software or electronic circuitry elements which taken together make up the "fault locating means" or "means for generating a fault location parameters m indicative of the location of the fault" in accordance with the invention. As is further well known and which will be well understood by those skilled in the art more fully as the present invention is described below, a microprocessor, as for example, the one MP described with reference to the fault locator FL of FIG. 2A, above, when programmed in accordance with the teachings of the present invention to perform particular functions pursuant to instructions of the type depicted by the flowchart of the labeled blocks within block 1000, will carry out the process or processes in accordance with the invention. As shown, the process begins by obtaining data from one end (the local end) of the transmission line. Thereafter, a determination is made whether the data is oscillographic data or phasor data. If the data is oscillographic data, phasors are calculated, for example, using a discrete Fourier transform. If the measured data is in phasor form, or after phasors have been calculated, the fault type is determined. Thereafter, a decision is made whether the pre-fault data is sound. If the pre-fault data is sound, an appropriate equation is selected for the calculation of the fault location parameter "m", which indicates the fault location on a per unit basis. "Sound" pre-fault data means that the pre-fault data are related in phase to the fault data. If this is the case, superimposed values can be calculated by subtracting the pre-fault data from the fault data. Thus, the load current needs to be stored in memory and related in phase with the fault current. If the pre-fault data is not sound, a decision is made whether the fault is a three-phase fault. If so, a classical reactance formula is employed to compensate for the fault through a resistance by measuring only the imaginary part of the apparent line impedance $Z_1 = R_1 + jX_1$. The per-unit distance to the fault from terminal A is calculated as follows:

$$m = \frac{Im(Z_{AC})}{Im(Z_1)} = \frac{Im\left(\frac{V_{Af}}{I_{sf}}\right)}{Im(Z_1)} \tag{0.1}$$

If the fault is not a three-phase fault, the reactance formula is not employed and the appropriate equation is selected as described below for the calculation of the fault location parameter.

The measured voltages and currents vary with the fault type. Furthermore, for a single-line-to-ground fault, measured current may be compensated with a zero sequence current. The reactance algorithm may introduce considerable error during a fault through a resistance (reactance effect). An improved algorithm may be employed for more accurate estimation of the fault location. To avoid supplying the values for source impedances, an assumption that the negative sequence current distribution factor is a real number may be used.

The per-unit distance to the fault may be estimated as:

$$m = \frac{\frac{Re(V_{Af})}{Re(\Delta I_s)} - \frac{Im(V_{Af})}{Im(\Delta I_s)}}{R_{l1} * \left[\frac{Re(I_{sf})}{Re(\Delta I_s)} - \frac{Im(I_{sf})}{Im(\Delta I_s)}\right] - X_{l1} * \left[\frac{Re(I_{sf})}{Im(\Delta I_s)} + \frac{Im(I_{sf})}{Re(\Delta I_s)}\right]} \tag{0.2}$$

Calculation of the superimposed current $\Delta I_s = I_{sf} - I_l$ requires the value of the pre-fault current $I_l$. However, for unbalanced faults, negative sequence current or manufactured current may be used if pre-fault current is not available. For the phase-to-phase-to-ground faults, superimposed current $\Delta I_s$ is needed. The calculation of the superimposed current requires knowledge of the pre-fault current $I_l$. Thus, the current $I_l$ needs to be stored in memory and related in phase with the current $I_{sf}$. This may be avoided by using a current in a heathy phase, which is assumed to be equal to its pre-fault value $I_l$. The pre-fault current that is actually needed is the pre-fault current for the faulted phases. Since the pre-fault currents are symmetrical and the healthy phase current is assumed equal to the load current, the pre-fault current for the faulted phases can be calculated from the current in the healthy phase.

Within block 1000 of FIG. 3B is a flowchart of an alternative embodiment of the fault location process, wherein additional steps are provided to compensate for the shunt admittance associated with long transmission lines. As shown, voltage and current data are obtained and the per-unit fault location parameter "m" is determined in accordance with the basic process outlined above. Thereafter, a decision is made whether compensation for long lines is desired. If so, the shunt admittance per unit length associated with the line is supplied by the user or otherwise obtained by the fault location system (e.g., from pre-stored data). The fault location process is then carried out in an iterative manner. In the first iteration, Isf and Irf are replaced with $I'_{sf}$ and $I'_{rf}$. The definition of these terms is provided below. Thereafter, $Z_{ld}$ and $Y_d$ are computed and used instead of $Z_l$ and Y in the fault location process described below. The process then continues as shown, with "m" being recalculated until it converges within some pre-specified limits. For example, the process could be continued until "m" in the most recent iteration is within 0.1% of its value from the previous iteration.

The flowchart within block 1000 of FIG. 3C depicts still another embodiment of the fault location process, wherein the process is adapted for radial lines. As shown, the fault location parameter "m" is first determined using the appropriate equation selected on the basis of the fault type. FIG. 3C indicates the correspondence between the equations disclosed below and the various fault types. Thereafter, the parameters $Z_{load}$, $Z_s$, β (beta) and arg(φ) are determined. Equation (32) is employed to determine φ (phi) that is used instead of $\Delta I_s$ in equation (0.2) to overcome sources of errors caused by the assumptions of the basic method. Thereafter, the fault location parameter is calculated and checked to determine whether it has converged within specified limits. Alternatively, a pre-specified number of iterations made be set. Finally, the fault location parameter is displayed.

FIGS. 4A–4C and 5 are single-line models of a faulted transmission line. The elements of the model represent physical quantities as follows:

$V_s$: Local source voltage $Z_s$: Local source impedance $I_{sf}$: Current at local fault locator $V_r$: Remote source voltage $Z_r$: Remote source impedance $I_{rf}$: Current at remote fault locator $V_{Af}$: Measured voltage at terminal A $V_{Bf}$: Measured voltage at terminal B $I_l$: Load current $Z_l$: Line impedance $Y_l$: Line admittance $V_f$: Fault voltage $I_f$: Fault current $V_{Afa}$: measured phase "a" fault voltage at terminal A $I_{sf2}$: negative sequence fault current at terminal A $I^F_{sfa}$: processed fault current at the relay for the phase "a" to ground fault (see equation 11)

$R_{l1}$: positive sequence line resistance $X_{l1}$: positive sequence line reactance $\Delta I_{s1}$: superimposed positive sequence current at the relay $V_{Afbc}$: measured phase "b" to phase "c" fault voltage at terminal A $I_{sfbc}$: phase "b" to phase "c" fault current at terminal A $\Delta I_{sbc}$: phase "b" to phase "c" superimposed fault current at terminal A $I_{sf2}$: already explained (see line 2)

$V_{Afa2}$: negative sequence voltage at terminal A $I_{sfa}$: phase "a" fault current at terminal A $\Delta I_{sa}$: phase "a" superimposed fault current at terminal A $R_f$: Fault resistance m Relay-to-fault reach (distance) on a scale of 0–1.

The data processing aspect of the invention will now be derived.

I. Basic System

Figure 4A:
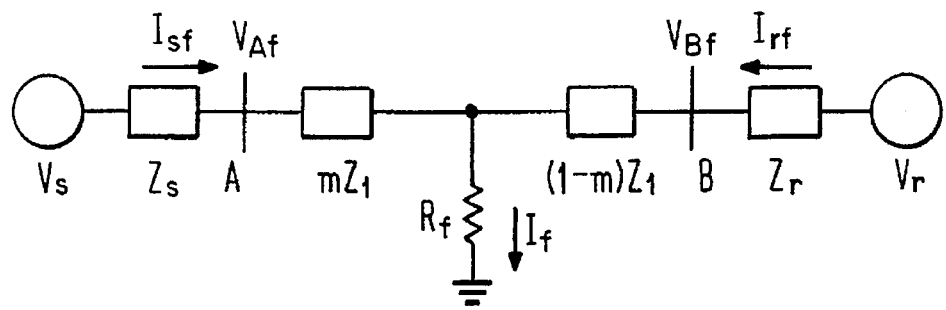
FIG. 4A is a single-line diagram of a transmission line system with a fault through an impedance $R_f$ on a homogeneous line of impedance $Z_l$ between buses A and B.

FIG. 4A is a single-line diagram of the system, with a fault through an impedance $R_f$ on a homogeneous line (impedance $Z_l$) between buses A and B. The parts of the system behind local and remote terminals have been replaced with Thevenin equivalents in FIGS. 4B and 4C. Using superposition, the faulted system has been decomposed into the pre-fault system, FIG. 4B, and the superimposed system, FIG. 4C. A single-phase representation is initially used as a preliminary step in deriving the fault location process for a multi-phase transmission system.

The value of the impedance measured at terminal A, for the fault through resistance $R_f$, is (from FIG. 4A):

$$Z_A = \frac{V_{Af}}{I_{sf}} = \frac{mZ_1 \cdot I_{sf} + R_f \cdot I_f}{I_{sf}} = mZ_1 + R_f \cdot \left(\frac{I_f}{I_{sf}}\right) = mZ_1 + R_f \cdot k_s \quad (1)$$

If the ratio ($k_s = I_f/I_{sf}$) of the fault current $I_f$ and the current at the fault locator FL location $I_{sf}$ is complex, the fault resistance may be represented as an impedance with a reactive component. By introducing pre-fault current $I_l$, difference (superimposed) current $\Delta I_s = I_{sf} - I_l$, and current distribution factor $d_s$, it follows that:

$$k_s = \frac{I_f}{I_{sf}} = \frac{\frac{\Delta I_s}{d_s}}{(\Delta I_s + I_1)} = \frac{1}{d_s} \cdot \frac{1}{n_s} \quad (2)$$

$$n_s = \frac{I_{sf}}{I_{sf} - I_1} = |n_s| \angle \gamma \quad (3)$$

The current distribution factor $d_s$ is:

$$d_s = \frac{\Delta I_s}{I_f} = \frac{Z_r + (1-m)Z_1}{Z_s + Z_r + Z_1} = |d_s| \angle \beta \quad (4)$$

In the case of parallel lines between terminals A and B, where the impedance of the parallel lines is $Z_p$, the current distribution factor $d_s$ is:

$$d_s = \frac{\Delta I_s}{I_f} = \frac{[Z_r + (1-m)Z_1]Z_p + (Z_s + Z_r)Z_1(1-m)}{(Z_s + Z_r + Z_1)Z_p + Z_1(Z_s + Z_r)} \quad (5)$$

For a multi-phase case, $d_s$ is represented by the appropriate equation from equation (6) below, where $d_{s1}$, $d_{s2}$, and $d_{s0}$ are the positive, negative, and zero sequence current distribution factors, and $Z_{l1}$ and $Z_{l0}$ are positive and zero sequence impedances of the protected line.

three-phase: $d_s = d_{s1}$ (6)
phase-phase: $d_s = d_{s1} + d_{s2}$ phase-ground: $d_s = \left(d_{s1} + d_{s2} + d_{s0}\frac{Z_{l0}}{Z_{l1}} + d_{Es0}\frac{Z_{M0}}{Z_{l1}}\right)/3$ In the equation for a phase-to-ground fault, $d_{Es0}$ is a current distribution factor that relates the zero sequence current in the parallel network $I_{Es0}$ (if one exists) with the zero sequence fault current $I_{f0}$, and $Z_{M0}$ is a total uniform zero sequence mutual impedance between the parallel lines.

To derive the present invention, it is assumed that the negative sequence current distribution factor $d_{s2}$ is a real number. The zero sequence current distribution factors $d_{s0}$ and $d_{Es0}$ do not affect the accuracy of the fault location estimate for ground faults. Furthermore, the accuracy of the system is not influenced by the magnitude of the negative sequence current distribution factor, and the error in the argument is moderate in practice. As discussed below, the fault location procedure has been derived for different types of faults.

a. Single-line-to-ground fault (a-g fault)

By setting up a serial connection of positive, negative, and zero sequence networks for the faulted and superimposed systems, the following equations are satisfied:

$$I_{f1} = I_{f2} = I_{f0} = \frac{I_f}{3} \quad (7)$$

$$\Delta I_{s1} = I_{f1} \cdot d_{s1} = I_{sf1} \quad (8)$$

$$\Delta I_{s2} = I_{f2} \cdot d_{s2} = I_{sf2} \quad (9)$$

$$\Delta I_{s0} = I_{f0} \cdot d_{s0} = I_{sf0} \quad (10)$$

Since the measured current $I_{sfa}$ needs to be compensated with zero sequence current, the processed fault current in phase "a" is:

$$I_{sfa}^F = I_{sfs} + \frac{Z_{l0} - Z_{l1}}{Z_{l1}} \cdot I_{sf0} \quad (11)$$

In the case of parallel lines, zero sequence mutual effects can be included in equation (11). If $Z_{M0}$ (the total uniform zero sequence mutual impedance between parallel lines) and $I_{Esf0}$ (the zero sequence current in the parallel lines) are known, it follows that:

$$I_{sfa}^F = I_{sfa} + \frac{Z_{l0} - Z_{l1}}{Z_{l1}} \cdot I_{sf0} + \frac{Z_{M0}}{Z_{l1}} \cdot I_{Esf0} \quad (12)$$

By analyzing FIG. 4A, applied for a phase-ground (a-g) fault, and by applying equations (7) and (9), the measured voltage in faulted phase a (at terminal A) is:

$$V_{Afa} = mZ_{l1} \cdot I_{sfa}^F + R_f \cdot I_f = mZ_{l1} \cdot I_{sfa}^F + R_f \cdot \frac{3 \cdot I_{sf2}}{d_{s2}} \quad (13)$$

If the argument of $d_{s2}$ is zero (i.e., if $d_{s2}$ is a real number), equation (13) can be written:

$$V_{Afa} = mZ_{l1} \cdot I_{sfa}^F + D \cdot I_{sf2} \quad (14)$$

Complex equation (14) can be separated into real and imaginary parts forming two equations with two unknowns, m and D. Eliminating D, the per-unit distance to the fault can be expressed as:

$$m = \frac{\dfrac{Re(V_{Afa})}{Re(I_{sf2})} - \dfrac{Im(V_{Afa})}{Im(I_{sf2})}}{R_{l1} \cdot \left[\dfrac{Re(I_{sfa}^F)}{Re(I_{sf2})} - \dfrac{Im(I_{sfa}^F)}{Im(I_{sf2})}\right] - X_{l1} \cdot \left[\dfrac{Re(I_{sfa}^F)}{Im(I_{sf2})} + \dfrac{Im(I_{sfa}^F)}{Re(I_{sf2})}\right]} \quad (15)$$

The positive-sequence and negative-sequence distribution factors $d_{s1}$ and $d_{s2}$, respectively, can be assumed to be equal. By using equations (7), (8), and (9), the difference current $\Delta I_{s1} = I_{sf1} - I_{la}$ may be employed in equation (15) instead of the current $I_{sf2}$. This would require the value of the pre-fault current $I_{la}$ that does not exist during a fault. The current $I_{la}$ must be related in phase with the positive sequence current $I_{sf1}$. If load flow unbalance exists in the pre-fault system, the latter approach is more accurate. Thus, the latter approach is recommended, unless sound pre-fault values are unavailable. If sound pre-fault values are available, equation (15) would be replaced with the following equation (15.1):

$$m = \frac{\frac{Re(V_{Afa})}{Re(\Delta I_{s1})} - \frac{Im(V_{Afa})}{Im(\Delta I_{s1})}}{R_{l1}*\left[\frac{Re(I^F_{sfa})}{Re(\Delta I_{s1})} - \frac{Im(I^F_{sfa})}{Im(\Delta I_{s1})}\right] - X_{l1}*\left[\frac{Re(I^F_{sfa})}{Im(\Delta I_{s1})} + \frac{Im(I^F_{sfa})}{Re(\Delta I_{s1})}\right]} \quad (15.1)$$

b. Phase-to-phase-to-ground fault (b-c-g fault)

From a parallel connection of the sequence networks, the following equation can be written:

$$V_{Af1} - V_{Af2} = mZ_{l1}*(I_{sf1} - I_{sf2}) + \frac{R_f}{2}*(I_{f1} - I_{f2}) \quad (16)$$

If equations (8) and (9) are applied, equation (16) may be rearranged as:

$$V_{Af1} - V_{Af2} = nZ_{l1}*(I_{sf1} - I_{sf2}) + \frac{R_f}{2}*\left(\frac{\Delta I_{s1}}{d_{s1}} - \frac{\Delta I_{s2}}{d_{s2}}\right) \quad (17)$$

By substituting $d_{s2}$ with $d_{s1}$ and symmetrical components with phase values, it follows that:

$$\frac{V_{Afb} - V_{Afc}}{a^2 - a} = mZ_{l1}*\frac{(I_{sfb} - I_{sfc})}{a^2 - a} + \frac{R_f}{2}*\frac{1}{d_{s1}}*\frac{(\Delta I_{sb} - \Delta I_{sc})}{a^2 - a} \quad (18)$$

If the argument of the current distribution factor $d_{s1}$ is assumed to be zero and if one cancels the term $(a^2-a)$, equation (18) may be expressed as:

$$V_{Afbc} = mZ_{l1}*I_{sfbc} + D*\Delta I_{sbc} \quad (19)$$

Equation (19) is similar to equation (14). Thus, the distance to the fault may be calculated as:

$$m = \frac{\frac{Re(V_{Afbc})}{Re(\Delta I_{sbc})} - \frac{Im(V_{Afbc})}{Im(\Delta I_{sbc})}}{R_{l1}*\left[\frac{Re(I_{sfbc})}{Re(\Delta I_{sbc})} - \frac{Im(I_{sfbc})}{Im(\Delta I_{sbc})}\right] - X_{l1}*\left[\frac{Re(I_{sfbc})}{Im(\Delta I_{sbc})} + \frac{Im(I_{sfbc})}{Re(\Delta I_{sbc})}\right]} \quad (20)$$

The calculation of the difference current $\Delta I_{sbc} = I_{sfbc} - I_{lbc}$ requires the value of the pre-fault current $I_{lbc}$, which does not exist during the fault. The current $I_{lbc}$ may be manufactured by using a current in a healthy phase (e.g., phase a), which may be assumed to be equal to the pre-fault value $I_{la}$. This assumption introduces an error and is recommended only if sound pre-fault values are unavailable.

c. Phase-to-phase fault (b-c fault)

Equation (20) can be readily applied in the phase-to-phase case. Further, the process may be altered by substituting a condition $I_{sf1} = -I_{sf2}$ into equation (16). If equation (9) is used, $(a^2-a)$ is replaced with $(-j\sqrt{3})$, and the argument of $d_{s2}$ is set to zero, it follows that:

$$V_{Afbc} = mX_{l1}*I_{sfbc} - R_f*\frac{I_{sf2}}{d_{s2}}*(-j\sqrt{3}) = mZ_{l1}*I_{sfbc} + D*jI_{sf2} \quad (21)$$

The per-unit distance to the fault is given by:

$$m = \frac{\frac{Re(V_{Afbc})}{-Im(I_{sf2})} - \frac{Im(V_{Afbc})}{Re(I_{sf2})}}{R_{l1}*\left[\frac{Re(I_{sfbc})}{-Im(I_{sf2})} - \frac{Im(I_{sfbc})}{Re(I_{sf2})}\right] - X_{l1}*\left[\frac{Re(I_{sfbc})}{Im(I_{sf2})} + \frac{Im(I_{sfbc})}{-Im(I_{sf2})}\right]} \quad (22)$$

d. Three-phase fault (a-b-c fault)

Fault location for three-phase faults can be accomplished by using any one of three phases. Applying equation (8) and assuming that the argument of the current distribution factor is zero, it follows that:

$$V_{Afa} = mZ_{l1}*I_{sfa} + R_f*I_f = mz_{l1}*I_{sfa} + R_f*\frac{\Delta I_{sa}}{d_{s1}} = mZ_{l1}*I_{sfa} + D*\Delta I_{sa} \quad (23)$$

The per-unit distance to the fault is given by:

$$m = \frac{\frac{Re(V_{Afa})}{re(\Delta I_{sa})} - \frac{Im(V_{Afa})}{Im(\Delta I_{sa})}}{R_{l1}*\left[\frac{Re(I_{sfa})}{Re(\Delta I_{sa})} - \frac{Im(I_{sfa})}{Im(\Delta I_{sa})}\right] - X_{l1}*\left[\frac{Re(I_{sfa})}{Im(\Delta I_{sa})} + \frac{Im(I_{sfa})}{Re(\Delta I_{sa})}\right]} \quad (24)$$

Calculation of the difference current $\Delta I_{sa} = I_{sfa} - I_{la}$ requires the value of the pre-fault current $I_{la}$.

II. Improved System

The value of impedance $Z_A$ (measured at terminal A) is described by equation (1) (single-phase representation). If we assume the angle $\beta$ is equal to zero (i.e., the current distribution factor is a real number), an impedance calculated at terminal A is given by:

$$Z_{Ae} = mZ_l + R_f*\frac{1}{/d_s/}*\frac{1}{/n_s/\angle\gamma} \quad (25)$$

The error (% of line length) of the fault location estimation can be expressed in a closed form as:

$$e_a(\%) = \frac{R_F}{/n_s/*/d_s/}*\frac{\sin\beta}{\sin(\gamma + \theta_{l1})}*\frac{100}{/Z_{l1}/} \quad (26)$$

Equation (26) can be applied to the multi-phase case. The inverse of the current distribution factor $(1/d_s)$ should be expressed with the appropriate equation chosen from the set of equations (6). This choice depends on the type of fault.

The inventive fault location process has been derived for the single-line-to-ground fault case by using only negative sequence current distribution factors. Thus, if zero sequence current distribution factors $d_{s0}$ and $d_{Es0}$ are not real numbers, no error is introduced into the fault location estimate. As a result, an error term of the process (for the single-line-to-ground fault) is given by:

$$e_{la}(\%) = \frac{3*R_F}{/n_{s1}/*/d_{s2}/}*\frac{\sin\beta_2}{\sin(\gamma_1 + \theta_{l1})}*\frac{100}{/Z_{l1}/} \quad (27)$$

For the chosen a-g fault, the ratio of the fault current and positive sequence superimposed current (or the negative sequence fault current $I_{sf2}$) is given by:

$$n_{s1} = \frac{I^F_{sfa}}{I_{sf1} - I_{sa}} = \frac{I^F_{sfa}}{\Delta I_{s1}} = /n_{s1}/\angle\gamma_1 \quad (28)$$

A superimposed phase current $\Delta I_{sa} = I_{sfa} - I_{la}$ may be used instead of the positive sequence superimposed current in equation (15.1). The error term is:

$$e_{id}^{\Phi}(\%) = \frac{3*R_F}{/I_{n_{s1}}/*/d_{s2}/} * \frac{\sin(\beta_2 - \lambda)}{\sin(\gamma_1 + \theta_{l1} + \lambda)} * \frac{100}{/Z_{l1}/} \quad (29)$$

where: $p = /p/\angle\lambda = \frac{\Delta I_{s1}}{\Delta I_{sa}}$

Any complex number $\Phi$ may be used instead of $\Delta I_{sa}$. If the argument of the complex number p is $\lambda=\beta_2$, the process can overcome sources of error represented by equation (29). This may be done by selecting an appropriate value for the argument of the complex number $\Phi$. However, the value of $\beta_2$ depends on the fault location "m", and can only be estimated.

a. Radial Lines

A radial line without a tapped load can be represented by FIG. 4A if the remote voltage source $V_r$ is short-circuited and the remote source impedance $Z_r$ is replaced with a load impedance $Z_{load}$. For a radial line without a tapped load, the load impedance $Z_{load}$ can be calculated from pre-fault data:

$$Z_{load} = \frac{V_A}{I_l} - Z_1 \quad (30)$$

Further, in equation (4), the remote source impedance $Z_r$ may be replaced with a load impedance $Z_{load}$. The source impedance behind the fault locator may be calculated (see FIG. 4C) from the fault and pre-fault voltages and currents at the terminal:

$$Z_s = -\frac{\Delta V_A}{\Delta I_s} \quad (31)$$

To avoid inaccurate calculations of the source impedance for small differences between pre-fault and fault values, values from the negative sequence network may be used for the unbalanced faults. An iterative procedure may be used for the accurate fault location estimation. This procedure will be explained in detail for the phase "a" to ground fault.

The value of the angle $\beta_2$ may be calculated from the equation for the current distribution factor in the negative sequence $d_{s2}$ (or positive sequence $d_{s1}$; $d_{s1}=d_{s2}$). The argument of $\Phi$ is given by:

$$\arg(\Phi) = \arg(\Delta I_{s1}) - \beta_2 \quad (32)$$

From equation (4), the current distribution factor in the negative sequence is:

$$d_{s2} = \frac{[Z_{load} + (1-m) * Z_{l2}]}{Z_{s2} + Z_{load} + Z_{l2}} = /d_{s2}/\angle\beta \quad (33)$$

where:

$$Z_{s2} = -V_{Af2}/I_{sf2} \quad (34)$$

and $Z_{l2}$ is the negative sequence line impedance. The next step is to calculate the argument of the complex number $\phi$:

$\arg(\phi)=\arg(I_{sf2})-\beta_2$ from equation (32)

The complex number $\phi$ is used instead of $I_{sf2}$ in equation (15) to calculate a new value for the fault location "$m_{new}$". Note that the magnitude of the complex number $\phi$ is irrelevant. This may be continued as an iterative procedure. The summarized iterative procedure, for the phase "a" to ground fault is as follows:

Step 1: Calculate fault location "m" by using equation (15).
Step 2: Calculate $Z_{load}$ and $Z_{s2}$ by using equations (30) and 34), respectively.
Step 3: Calculate $\beta_2$ by using equation (33).
Step 4: Calculate $\arg(\phi)$ by using equation (32).
Step 5: Replace $I_{sf2}$ with $\phi$ in equation (15) and, from this equation, calculate the new fault location "$m_{new}$".
Step 6: Go back to step 3 and repeat the procedure until "m" converges within specified limits (e.g. 0.1%) or the number of iterations is larger than a specified number (e.g. 5).

A similar procedure can be implemented for any other fault type.

The fault resistance may also be determined and made available to the user for diagnosis of the condition of tower footing resistance structures. The fault resistance path may be determined from:

$$R_f = \left[ Re\left(\frac{V_{Afa}}{I_{sfa}^F}\right) - m*Re(Z_{l1}) \right] / \left[ 3*Re\left(\frac{1}{d_{s2}} * n_{s1}\right) \right] \quad (35)$$

b. Cutting off the peaks of errors

If the X/R ratio is not equal throughout the transmission network shown in FIG. 4A, there exists a fault location point where the fault location error is zero. This point exists for a large number of practical cases. The fault location system overestimates in one direction and underestimates in the other direction. Fault locators at both ends of the line have zero error for the same fault location. However, if the remote source impedance angle is equal to the line impedance angle, it follows that $\beta$ is a constant. Thus, there is no fault location point where the error is zero. In any event, if one fault locator overestimates (underestimates), the other will underestimate (overestimate). Thus, the two fault locators introduce error in the same direction from the fault.

If there is a difference between two estimates of fault location, one can introduce the argument of the current distribution factor ($\beta$) into the fault location calculation. This difference should be larger than the error introduced by the other error sources. Values of $\beta$, for both fault locators, may be assumed from the initial fault location calculations. New estimates of fault location may be calculated using the argument of complex number $\Phi$ calculated as in equation (32). Both of these estimates should converge toward the exact value of the fault location (an incorrect sign of $\beta$ can be detected). This may be applied as an iterative procedure. To avoid introducing an error in the opposite direction of the actual fault location, the increase in the value of $\beta$ should not be too large. However, knowledge of the actual range of source impedances can be helpful.

c. Compensation for long lines

Figure 5:
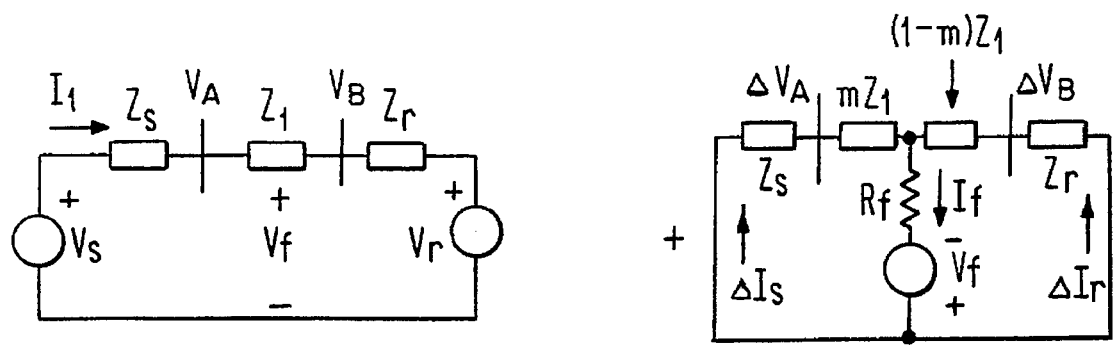
FIG. 5 is a single-line model of a faulted transmission line with shunt capacitances.
Figure 5:
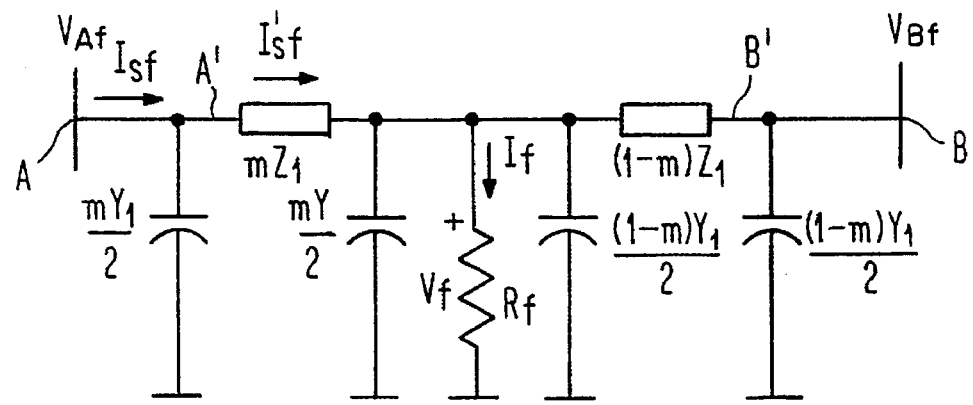

If the fault location process does not compensate for shunt admittances, considerable error may be introduced, particularly on higher voltage levels and longer lines. A single line diagram of the system line $\Pi$ model (with shunt capacitances) before and after the fault is shown in FIG. 5. The compensation for shunt elements is achieved by replacing the measured current $I_{sf}$ at terminal A with the current $I_{sf}'$. However, the value of the fault location parameter "m" should be estimated for compensation. The initial value of fault location "m" may be estimated using the basic technique without compensation. Compensation may also be continued as an iterative procedure.

For a long line application, distributed line models may be required to provide a more accurate fault location estimate. However, the line $\Pi$ model may be related to the distributed ABCD model through the following equations for series impedance (36) and shunt admittance (37):

$$Z_{1d} = Z_1 \left[ \frac{\sinh(v*1)}{v*1} \right] \quad (36)$$

-continued $$\frac{Y_d}{2} = \frac{Y}{2} \left[ \frac{\tanh\left(\frac{v*1}{2}\right)}{\frac{v*1}{2}} \right] \quad (37)$$

where: $v=\sqrt{zy}$ is the propagation constant; $l=x/m$ is the line length; z is the series impedance in ohms per mile; y is the shunt admittance in Siemens per mile; $Z_l=z*1$, and $Y=y*1$. Consequently, the series impedance and shunt admittance for the Π model between the fault locator and the fault (see FIG. 4) may be represented by equations (38) and (39), respectively:

$$mZ_{1d} = mZ_1 \left[ \frac{\sinh(v*x)}{v*x} \right] = mZ_1 \left[ \frac{\sinh(v*1*m)}{v*1*m} \right] \quad (38)$$

$$\frac{mY_d}{2} = \frac{mY}{2} \left[ \frac{\tanh\left(\frac{v*x}{2}\right)}{\frac{v*x}{2}} \right] = \frac{mY}{2} \left[ \frac{\tanh\left(\frac{v*1*m}{2}\right)}{\frac{v*1*m}{2}} \right] \quad (39)$$

The values of $Z_{ld}$ and $Y_d$, from equations (38) and (39), may be calculated and used instead of $Z_l$ and Y, respectively, to improve the fault location estimate. Thus, correction for long lines (distributed parameter model) may be achieved by using the following equations:

$$Z_{1d} = Z_1 \left[ \frac{\sinh(v*1*m)}{v*1*m} \right] \quad (40)$$

$$\frac{Y_d}{2} = \frac{Y}{2} \left[ \frac{\tanh\left(\frac{v*1*m}{2}\right)}{\frac{v*1*m}{2}} \right] \quad (41)$$

The values of $Z_{ld}$ and $Y_d$ from equations (40) and (41) may be used instead of $Z_l$ and Y when required. Equations (40) and (41) are appropriate for positive, negative, and zero sequence impedances and admittances. However, the value of the fault location parameter "m" should be estimated for compensation. The initial value of m may be estimated using the same technique without compensation. Compensation may be continued as an iterative procedure.

III. Conclusion

The inventive system has been tested and the following conclusions have been made:

(a) Knowledge of the source impedances is not required. Unlike algorithms that require such knowledge, moderate changes in network configuration will not degrade the system's accuracy. Thus, the inventive fault location system offers the best compromise in terms of the necessary system data and the accuracy of fault location determination for one-ended algorithms.

(b) The system compensates well for the pre-fault load flow and adequate accuracy is expected for a variety of practical fault cases.

(c) The system is insensitive to the zero sequence current distribution factor.

(d) Further improvement of the system can be achieved by compensation for long lines and charging currents.

(e) Pre-fault data are not required for the single-line-to-ground and phase-to-phase faults. Manufactured data are used for the phase-to-phase-to-ground fault if the pre-fault data are not available. The reactance algorithm is used for the three phase fault if the pre-fault data are not available.

(f) A very accurate technique (without assumptions for the angle of the current distribution factor) is provided for radial lines without tapped loads.

Implementation and selection decisions depend on the data available. These decisions may be made automatically or by the user. The fault location estimation procedure and required phasors for each case are described below.

1. Phase-to-ground (a-g) faults
    1.1. Sound pre-fault data: superimposed current $\Delta I_{sa} = I_{sf1} - I_{la}$, where $I_{sf1}$ and $I_{la}$ are positive sequence and load current, respectively; voltage and compensated current at the relay location, $V_{Afa}$ and $I^F_{sfa}$, respectively.
    1.2. No sound pre-fault data: corresponding negative sequence current $I_{sf2}$, voltage and compensated current at relay location, $V_{Afa}$ and $I^F_{sfa}$, respectively.

2. Phase-to-phase (b-c) faults
    2.1. Sound pre-fault data: superimposed current $\Delta I_{sbc} = I_{sbc} - I_{lbc}$, voltage and current at relay location, $V_{Abcf}$ and $I_{sfbc}$, respectively.
    2.2 No sound pre-fault data: corresponding negative sequence current $I_{sf2}$, voltage and current at relay location, $V_{Abcf}$ and $I_{sfbc}$, respectively.

3. Phase-to-phase-to-ground (b-c-g) faults
    3.1. Sound pre-fault data: superimposed current $\Delta I_{sbc} = I_{sfbc} - I_{lbc}$, voltage and current at relay location, $V_{Abcf}$ and $I_{sfbc}$, respectively.
    3.2. No sound pre-fault data: superimposed current $\Delta I_{sbc} = I_{sfbc} - I_{lbc}$, where manufactured load current $I_{lbc} = I_{sfa}*(a^2-a)$; voltage and current at relay location, $V_{Abcf}$ and $I_{sfbc}$, respectively.

4. Three phase (a-b-c) faults
    4.1. Sound pre-fault data: superimposed current $\Delta I_{sa} = I_{sfa} - I_{la}$, voltage and compensated current at relay location, $V_{Afa}$ and $I_{sfa}$, respectively.
    4.2. No sound pre-fault data: reactance algorithm, voltage and compensated current at relay location, $V_{Afa}$ and $I_{sfa}$, respectively.

The following table indicates the voltages and currents that may be used in equations (15), (20), (22), and (24), depending on the fault type.

| FAULT TYPE | fault voltage - $V_{Af}$ | fault current - $I_{sf}$ | sequence current - $I_{a,seq}$ |
|---|---|---|---|
| a-g | $V_{Afa}$ | $I_{sfa}^F$ | $I_{sf2}$ or $\Delta I_{s1}$ |
| b-g | $V_{Afb}$ | $I_{sfb}^F$ | $I_{sf2b}$ or $\Delta I_{s1b}$ |
| c-g | $V_{Afc}$ | $I_{sfc}^F$ | $I_{sf2c}$ or $\Delta I_{s1c}$ |
| b-c | $V_{Afbc}$ | $I_{sfbc}$ | $I_{sf2}$ or $\Delta I_{s1}$ |
| a-b | $V_{Afab}$ | $I_{sfab}$ | $I_{sf2c}$ or $\Delta I_{s1c}$ |
| c-a | $V_{Afca}$ | $I_{sfca}$ | $I_{sf2b}$ or $\Delta I_{s1b}$ |
| b-c-g | $V_{Afbc}$ | $I_{sfbc}$ | $\Delta I_{sbc}$ |
| a-b-g | $V_{Afab}$ | $I_{sfab}$ | $\Delta I_{sab}$ |
| c-a-g | $V_{Afca}$ | $I_{sfca}$ | $\Delta I_{scb}$ |
| a-b-c | $V_{Afa}$ | $I_{sfa}$ | $\Delta I_{sa1}$ |

Note:
$I_{sf2}$ is negative sequence current related to phase "a". $I_{sf2b}$ is negative sequence current related to phase "b". Current $I_{sf2b}$ lags $I_{sf2}$ by 120° and current $I_{sf2c}$ leads $I_{sf2}$ by 120°.

The above description of preferred embodiments is not intended to impliedly limit the scope of protection of the following claims. Thus, for example, except where they are expressly so limited, the following claims are not limited to applications involving three-phase power systems. Moreover, the claims are not limited to fault location systems associated with any particular section (i.e., transformer, feeder, high power transmission line, etc.) of a power distribution system.

We claim:

1. A process for locating a fault associated with one or more conductors of a multi-phase electric power transmission or distribution system, said fault being one of the following group of fault types: phase-to-ground, phase-to-phase-to-ground, phase-to-phase, and phase-to-phase-to-phase; said process comprising the steps of:

(a) obtaining a voltage phasor ($V_{Af}$) and a current phasor ($I_{sf}$), said voltage phasor being indicative of an amplitude and phase associated with a voltage waveform at a first prescribed location and said current phasor being indicative of an amplitude and phase associated with a current waveform at said first prescribed location;

(b) generating a fault location parameter m indicative of the location of the fault, wherein said fault location parameter is generated on the basis of at least one of the following equations:

(1) for a phase-to-ground fault, $$m = \frac{\frac{Re(V_{Afa})}{Re(I_{sf2})} - \frac{Im(V_{Afa})}{Im(I_{sf2})}}{R_{l1} * \left[ \frac{Re(I^F_{sfa})}{Re(I_{sf2})} - \frac{Im(I^F_{sfa})}{Im(I_{sf2})} \right] - X_{l1} * \left[ \frac{Re(I^F_{sfa})}{Im(I_{sf2})} + \frac{Im(I^F_{sfa})}{Re(I_{sf2})} \right]}$$

or $$m = \frac{\frac{Re(V_{Afa})}{Re(\Delta I_{s1})} - \frac{Im(V_{Afa})}{Im(\Delta I_{s1})}}{R_{l1} * \left[ \frac{Re(I^F_{sfa})}{Re(\Delta I_{s1})} - \frac{Im(I^F_{sfa})}{Im(\Delta I_{s1})} \right] - X_{l1} * \left[ \frac{Re(I^F_{sfa})}{Im(\Delta I_{s1})} + \frac{Im(I^F_{sfa})}{Re(\Delta I_{s1})} \right]}$$

wherein $V_{Afa}$ represents a measured phase a fault voltage; $I_{sf2}$ represents a negative sequence fault current; $I^F_{sfa}$ represents a measured phase a fault current compensated with a zero sequence current; $R_{l1}$ represents a positive sequence line resistance; $X_{l1}$ represents a positive sequence line reactance; and $\Delta I_{s1}$ represents a superimposed positive sequence current;

(2) for a phase-to-phase-to-ground fault, $$m = \frac{\frac{Re(V_{Afbc})}{Re(\Delta I_{sbc})} - \frac{Im(V_{Afbc})}{Im(\Delta I_{sbc})}}{R_{l1} * \left[ \frac{Re(I_{sfbc})}{Re(\Delta I_{sbc})} - \frac{Im(I_{sfbc})}{Im(\Delta I_{sbc})} \right] - X_{l1} * \left[ \frac{Re(I_{sfbc})}{Im(\Delta I_{sbc})} + \frac{Im(I_{sfbc})}{Re(\Delta I_{sbc})} \right]}$$

wherein $V_{Afbc}$ represents a measured phase b to phase c fault voltage; $I_{sfbc}$ represents a phase b to phase c fault current; and $\Delta I_{sbc}$ represents a phase b to phase c superimposed fault current;

(3) for a phase-to-phase fault, $$m = \frac{\frac{Re(V_{Afbc})}{-Im(I_{sf2})} - \frac{Im(V_{Afbc})}{Re(I_{sf2})}}{R_{l1} * \left[ \frac{Re(I_{sfbc})}{-Im(I_{sf2})} - \frac{Im(I_{sfbc})}{Re(I_{sf2})} \right] - X_{l1} * \left[ \frac{Re(I_{sfbc})}{Re(I_{sf2})} + \frac{Im(I_{sfbc})}{-Im(I_{sf2})} \right]} ;$$

(4) for a phase-to-phase-to-phase fault, $$m = \frac{\frac{Re(V_{Afa})}{re(\Delta I_{sa})} - \frac{Im(V_{Afa})}{Im(\Delta I_{sa})}}{R_{l1} * \left[ \frac{Re(I_{sfa})}{Re(\Delta I_{sa})} - \frac{Im(I_{sfa})}{Im(\Delta I_{sa})} \right] - X_{l1} * \left[ \frac{Re(I_{sfa})}{Im(\Delta I_{sa})} + \frac{Im(I_{sfa})}{Re(\Delta I_{sa})} \right]}$$

wherein $I_{sfa}$ represents a phase a fault current; and $\Delta I_{sa}$ represents a phase a superimposed fault current.

2. A process as recited in claim 1, further comprising the subsequent step of remedying the fault after its location has been determined.

3. A process as recited in claim 1, further comprising the subsequent step of compensating said fault location parameter m for a distributed shunt admittance associated with the conductors.

4. A process as recited in claim 1, further comprising the following radial line compensation steps after calculating the fault location parameter m:

(1) calculating a load impedance $Z_{load}$ and a negative sequence impedance $Z_{s2}$;

(2) calculating an argument $\beta_2$ of a negative sequence current distribution factor;

(3) calculating $\arg(\phi)$ as a function of $\beta_2$ and a superimposed sequence current;

(4) expressing $Z_{load}$ as a function of $\phi$ and, from this expression, calculating a new fault location parameter $m_{new}$; and (5) going back to step (2) and repeating the procedure until m converges within specified limits or the number of iterations is larger than a specified number.

5. A system for locating a fault associated with one or more conductors of a multi-phase electric power transmission or distribution system, said fault being one of the following group of fault types: phase-to-ground, phase-to-phase-to-ground, phase-to-phase, and phase-to-phase-to-phase, comprising:

(a) means for obtaining a voltage phasor ($V_{Af}$) and a current phasor ($I_{sf}$), said voltage phasor being indicative of an amplitude and phase associated with a voltage waveform at a first prescribed location and said current phasor being indicative of an amplitude and phase associated with a current waveform at said first prescribed location; and (b) means for generating a fault location parameter m indicative of the location of the fault, wherein said fault location parameter is generated on the basis of at least one of the following equations:

(1) for a phase-to-ground fault, $$m = \frac{\frac{Re(V_{Afa})}{Re(I_{sf2})} - \frac{Im(V_{Afa})}{Im(I_{sf2})}}{R_{l1} * \left[ \frac{Re(I^F_{sfa})}{Re(I_{sf2})} - \frac{Im(I^F_{sfa})}{Im(I_{sf2})} \right] - X_{l1} * \left[ \frac{Re(I^F_{sfa})}{Im(I_{sf2})} + \frac{Im(I^F_{sfa})}{Re(I_{sf2})} \right]}$$

or

-continued
$$m = \frac{\frac{Re(V_{Afa})}{Re(\Delta I_{s1})} - \frac{Im(V_{Afa})}{Im(\Delta I_{s1})}}{R_{l1} * \left[ \frac{Re(I^F_{sfa})}{Re(\Delta I_{s1})} - \frac{Im(I^F_{sfa})}{Im(\Delta I_{s1})} \right] - X_{l1} * \left[ \frac{Re(I^F_{sfa})}{Im(\Delta I_{s1})} + \frac{Im(I^F_{sfa})}{Re(\Delta I_{s1})} \right]}$$

wherein $V_{Afa}$ represents a measured phase a fault voltage; $I_{sf2}$ represents a negative sequence fault current; $I^F_{sfa}$ represents a measured phase a fault current compensated with a zero sequence current; $R_{l1}$ represents a positive sequence line resistance; $X_{l1}$ represents a positive sequence line reactance; and $\Delta I_{s1}$ represents a superimposed positive sequence current;

(2) for a phase-to-phase-to-ground fault, $$m = \frac{\frac{Re(V_{Afbc})}{Re(\Delta I_{sbc})} - \frac{Im(V_{Afbc})}{Im(\Delta I_{sbc})}}{R_{l1} * \left[ \frac{Re(I_{sfbc})}{Re(\Delta I_{sbc})} - \frac{Im(I_{sfbc})}{Im(\Delta I_{sbc})} \right] - X_{l1} * \left[ \frac{Re(I_{sfbc})}{Im(\Delta I_{sbc})} + \frac{Im(I_{sfbc})}{Re(\Delta I_{sbc})} \right]}$$

wherein $V_{Afbc}$ represents a measured phase b to phase c fault voltage; $I_{sfbc}$ represents a phase b to phase c fault current; and $\Delta I_{sbc}$ represents a phase b to phase c superimposed fault current;

(3) for a phase-to-phase fault, $$m = \frac{\frac{Re(V_{Afbc})}{-Im(I_{sf2})} - \frac{Im(V_{Afbc})}{Re(I_{sf2})}}{R_{l1} * \left[ \frac{Re(I_{sfbc})}{-Im(I_{sf2})} - \frac{Im(I_{sfbc})}{Re(I_{sf2})} \right] - X_{l1} * \left[ \frac{Re(I_{sfbc})}{Re(I_{sf2})} + \frac{Im(I_{sfbc})}{-Im(I_{sf2})} \right]};$$

(4) for a phase-to-phase-to-phase fault, $$m = \frac{\frac{Re(V_{Afa})}{re(\Delta I_{sa})} - \frac{Im(V_{Afa})}{Im(\Delta I_{sa})}}{R_{l1} * \left[ \frac{Re(I_{sfa})}{Re(\Delta I_{sa})} - \frac{Im(I_{sfa})}{Im(\Delta I_{sa})} \right] - X_{l1} * \left[ \frac{Re(I_{sfa})}{Im(\Delta I_{sa})} + \frac{Im(I_{sfa})}{Re(\Delta I_{sa})} \right]}$$

wherein $I_{sfa}$ represents a phase a fault current; and $\Delta I_{sa}$ represents a phase a superimposed fault current.

6. A system as recited in claim 5, further comprising means for compensating said fault location parameter m for a distributed shunt admittance and line impedance associated with the conductors.

7. A system as recited in claim 5, wherein said means for obtaining a voltage phasor ($V_{Af}$) and a current phasor ($I_{sf}$) comprises a protective relay.

8. A system as recited in claim 5, wherein said means for obtaining a voltage phasor ($V_{Af}$) and a current phasor ($I_{sf}$) comprises voltage and current transformers.

9. A system as recited in claim 5, wherein said means for obtaining a voltage phasor ($V_{Af}$) and a current phasor ($I_{sf}$) comprises a microprocessor.

10. A system as recited in claim 5, wherein said means for obtaining a voltage phasor ($V_{Af}$) and a current phasor ($I_{sf}$) comprises an oscillograph.

11. A system as recited in claim 5, further comprising means for remedying the fault after its location has been determined.

12. A system as recited in claim 11, wherein said means for remedying the fault comprises a circuit breaker.

13. A system as recited in claim 5, wherein said means for generating a fault location parameter comprises a programmed computer.

14. An electric power transmission or distribution system, comprising:

(a) a plurality of conductors on which a fault could occur;

(b) means for obtaining a voltage phasor ($V_{Af}$) and a current phasor ($I_{sf}$), said voltage phasor being indicative of an amplitude and phase associated with a voltage waveform at a first prescribed location and said current phasor being indicative of an amplitude and phase associated with a current waveform at said first prescribed location, said means for obtaining a voltage phasor ($V_{Af}$) and a current phasor ($I_{sf}$) comprising a member of the group consisting of a protective relay, voltage and current transformers, a microprocessor, and an oscillograph;

(c) means for generating a fault location parameter m indicative of the location of the fault, wherein said fault location parameter is generated on the basis of at least one of the following equations:

(1) for a phase-to-ground fault, $$m = \frac{\frac{Re(V_{Afa})}{Re(I_{sf2})} - \frac{Im(V_{Afa})}{Im(I_{sf2})}}{R_{l1} * \left[ \frac{Re(I^F_{sfa})}{Re(I_{sf2})} - \frac{Im(I^F_{sfa})}{Im(I_{sf2})} \right] - X_{l1} * \left[ \frac{Re(I^F_{sfa})}{Im(I_{sf2})} + \frac{Im(I^F_{sfa})}{Re(I_{sf2})} \right]}$$

or $$m = \frac{\frac{Re(V_{Afa})}{Re(\Delta I_{s1})} - \frac{Im(V_{Afa})}{Im(\Delta I_{s1})}}{R_{l1} * \left[ \frac{Re(I^F_{sfa})}{Re(\Delta I_{s1})} - \frac{Im(I^F_{sfa})}{Im(\Delta I_{s1})} \right] - X_{l1} * \left[ \frac{Re(I^F_{sfa})}{Im(\Delta I_{s1})} + \frac{Im(I^F_{sfa})}{Re(\Delta I_{s1})} \right]}$$

wherein $V_{Afa}$ represents a measured phase a fault voltage; $I_{sf2}$ represents a negative sequence fault current; $I^F_{sfa}$ represents a measured phase a fault current compensated with a zero sequence current; $R_{l1}$ represents a positive sequence line resistance; $X_{l1}$ represents a positive sequence line reactance; and $\Delta I_{s1}$ represents a superimposed positive sequence current;

(2) for a phase-to-phase-to-ground fault, $$m = \frac{\frac{Re(V_{Afbc})}{-Re(\Delta I_{sbc})} - \frac{Im(V_{Afbc})}{Im(\Delta I_{sbc})}}{R_{l1} * \left[ \frac{Re(I_{sfbc})}{Re(\Delta I_{sbc})} - \frac{Im(I_{sfbc})}{Im(\Delta I_{sbc})} \right] - X_{l1} * \left[ \frac{Re(I_{sfbc})}{Im(\Delta I_{sbc})} + \frac{Im(I_{sfbc})}{Re(\Delta I_{sbc})} \right]}$$

wherein $V_{Afbc}$ represents a measured phase b to phase c fault voltage; $I_{sfbc}$ represents a phase b to phase c fault current; and $\Delta I_{sbc}$ represents a phase b to phase c superimposed fault current;

(3) for a phase-to-phase fault, $$m = \frac{\frac{Re(V_{Afbc})}{-Im(I_{sf2})} - \frac{Im(V_{Afbc})}{Re(I_{sf2})}}{R_{l1}* \left[\frac{Re(I_{sfbc})}{-Im(I_{sf2})} - \frac{Im(I_{sfbc})}{Re(I_{sf2})}\right] - X_{l1}* \left[\frac{Re(I_{sfbc})}{Re(I_{sf2})} + \frac{Im(I_{sfbc})}{-Im(I_{sf2})}\right]} ;$$

(4) for a phase-to-phase-to-phase fault, $$m = \frac{\frac{Re(V_{Afa})}{re(\Delta I_{sa})} - \frac{Im(V_{Afa})}{Im(\Delta I_{sa})}}{R_{l1}* \left[\frac{Re(I_{sfa})}{Re(\Delta I_{sa})} - \frac{Im(I_{sfa})}{Im(\Delta I_{sa})}\right] - X_{l1}* \left[\frac{Re(I_{sfa})}{Im(\Delta I_{sa})} + \frac{Im(I_{sfa})}{Re(\Delta I_{sa})}\right]}$$

wherein $I_{sfa}$ represents a phase a fault current; and $\Delta I_{sa}$ represents a phase a superimposed fault current.

15. A system as recited in claim 14, further comprising a circuit breaker for remedying the fault after its location has been determined.

16. A system as recited in claim 14, wherein said means for generating a fault location parameter comprises a programmed microprocessor.

17. A system for locating a fault associated with one or more conductors of a multi-phase electric power transmission or distribution system, said fault being one of the following group of fault types: phase-to-ground, phase-to-phase-to-ground, phase-to-phase, and phase-to-phase-to-phase, comprising:

(a) means comprising at least one of the following: (i) a protective relay; (ii) voltage and current transformers; (iii) a microprocessor relay; and, (iv) an oscillograph for obtaining a voltage phasor ($V_{Af}$) and a current phasor ($I_{sf}$), said voltage phasor being indicative of an amplitude and phase associated with a voltage waveform at a first prescribed location and said current phasor being indicative of an amplitude and phase associated with a current waveform at said first prescribed location; and (b) fault locating means, operatively coupled to said means for obtaining a voltage phasor ($V_{Af}$) and a current phasor ($I_{sf}$), for generating a fault location parameter m indicative of the location of the fault, wherein said fault location parameter is generated on the basis of at least one of the following equations:

(1) for a phase-to-ground fault, $$m = \frac{\frac{Re(V_{Afa})}{Re(I_{sf2})} - \frac{Im(V_{Afa})}{Im(I_{sf2})}}{R_{l1}* \left[\frac{Re(I^F_{sfa})}{Re(I_{sf2})} - \frac{Im(I^F_{sfa})}{Im(I_{sf2})}\right] - X_{l1}* \left[\frac{Re(I^F_{sfa})}{Im(I_{sf2})} + \frac{Im(I^F_{sfa})}{Re(I_{sf2})}\right]}$$

or $$m = \frac{\frac{Re(V_{Afa})}{Re(\Delta I_{s1})} - \frac{Im(V_{Afa})}{Im(\Delta I_{s1})}}{R_{l1}* \left[\frac{Re(I^F_{sfa})}{Re(\Delta I_{s1})} - \frac{Im(I^F_{sfa})}{Im(\Delta I_{s1})}\right] - X_{l1}* \left[\frac{Re(I^F_{sfa})}{Im(\Delta I_{s1})} + \frac{Im(I^F_{sfa})}{Re(\Delta I_{s1})}\right]}$$

wherein $V_{Afa}$ represents a measured phase a fault voltage; $I_{sf2}$ represents a negative sequence fault current; $I^F_{sfa}$ represents a measured phase a fault current compensated with a zero sequence current; $R_{l1}$ represents a positive sequence line resistance; $X_{l1}$ represents a positive sequence line reactance; and $\Delta I_{s1}$ represents a superimposed positive sequence current;

(2) for a phase-to-phase-to-ground fault, $$m = \frac{\frac{Re(V_{Afbc})}{Re(\Delta I_{sbc})} - \frac{Im(V_{Afbc})}{Im(\Delta I_{sbc})}}{R_{l1}* \left[\frac{Re(I_{sfbc})}{Re(\Delta I_{sbc})} - \frac{Im(I_{sfbc})}{Im(\Delta I_{sbc})}\right] - X_{l1}* \left[\frac{Re(I_{sfbc})}{Im(\Delta I_{sbc})} + \frac{Im(I_{sfbc})}{Re(\Delta I_{sbc})}\right]}$$

wherein $V_{Afbc}$ represents a measured phase b to phase c fault voltage; $I_{sfbc}$ represents a phase b to phase c fault current; and $\Delta I_{sbc}$ represents a phase b to phase c superimposed fault current;

(3) for a phase-to-phase fault, $$m = \frac{\frac{Re(V_{Afbc})}{-Im(I_{sf2})} - \frac{Im(V_{Afbc})}{Re(I_{sf2})}}{R_{l1}* \left[\frac{Re(I_{sfbc})}{-Im(I_{sf2})} - \frac{Im(I_{sfbc})}{Re(I_{sf2})}\right] - X_{l1}* \left[\frac{Re(I_{sfbc})}{Re(I_{sf2})} + \frac{Im(I_{sfbc})}{-Im(I_{sf2})}\right]} ;$$

(4) for a phase-to-phase-to-phase fault, $$m = \frac{\frac{Re(V_{Afa})}{re(\Delta I_{sa})} - \frac{Im(V_{Afa})}{Im(\Delta I_{sa})}}{R_{l1}* \left[\frac{Re(I_{sfa})}{Re(\Delta I_{sa})} - \frac{Im(I_{sfa})}{Im(\Delta I_{sa})}\right] - X_{l1}* \left[\frac{Re(I_{sfa})}{Im(\Delta I_{sa})} + \frac{Im(I_{sfa})}{Re(\Delta I_{sa})}\right]}$$

wherein $I_{sfa}$ represents a phase a fault current; and $\Delta I_{sa}$ represents a phase a superimposed fault current.

18. A system as recited in claim 17, wherein said fault locating means, operatively coupled to said means for obtaining a voltage phasor ($V_{Af}$) and a current phasor ($I_{sf}$), for generating a fault location parameter m indicative of the location of the fault also performs the function of compensating said fault location parameter m for a distributed shunt admittance and line impedance associated with the conductors.

19. A system as recited in claim 17, further comprising means, operatively coupled to said power transmission or distribution system, for remedying the fault after its location has been determined.

20. An electric power transmission or distribution system, comprising:

(a) a plurality of conductors on which a fault could occur;

(b) means for obtaining a voltage phasor ($V_{Af}$) and a current phasor ($I_{sf}$), said voltage phasor being indicative of an amplitude and phase associated with a voltage waveform at a first prescribed location and said current phasor being indicative of an amplitude and phase associated with a current waveform at said first prescribed location, said means for obtaining a voltage phasor ($V_{Af}$) and a current phasor ($I_{sf}$) comprising at least one of the following: a protective relay, voltage and current transformers, a microprocessor, and an oscillograph;

(c) fault locating means, operatively coupled to said means for obtaining a voltage phasor ($V_{Af}$) and a current phasor ($I_{sf}$), for generating a fault location parameter m indicative of the location of the fault, wherein said fault location parameter is generated on the basis of at least one of the following equations:

(1) for a phase-to-ground fault, $$m = \frac{\frac{Re(V_{Afa})}{Re(I_{sf2})} - \frac{Im(V_{Afa})}{Im(I_{sf2})}}{R_{l1}*\left[\frac{Re(I^F_{sfa})}{Re(I_{sf2})} - \frac{Im(I^F_{sfa})}{Im(I_{sf2})}\right] - X_{l1}*\left[\frac{Re(I^F_{sfa})}{Im(I_{sf2})} + \frac{Im(I^F_{sfa})}{Re(I_{sf2})}\right]}$$

or $$m = \frac{\frac{Re(V_{Afa})}{Re(\Delta I_{s1})} - \frac{Im(V_{Afa})}{Im(\Delta I_{s1})}}{R_{l1}*\left[\frac{Re(I^F_{sfa})}{Re(\Delta I_{s1})} - \frac{Im(I^F_{sfa})}{Im(\Delta I_{s1})}\right] - X_{l1}*\left[\frac{Re(I^F_{sfa})}{Im(\Delta I_{s1})} + \frac{Im(I^F_{sfa})}{Re(\Delta I_{s1})}\right]}$$

wherein $V_{Afa}$ represents a measured phase a fault voltage; $I_{sf2}$ represents a negative sequence fault current; $I^F_{sfa}$ represents a measured phase a fault current compensated with a zero sequence current; $R_{l1}$ represents a positive sequence line resistance; $X_{l1}$ represents a positive sequence line reactance; and $\Delta I_{s1}$ represents a superimposed positive sequence current;

(2) for a phase-to-phase-to-ground fault, $$m = \frac{\frac{Re(V_{Afbc})}{Re(\Delta I_{sbc})} - \frac{Im(V_{Afbc})}{Im(\Delta I_{sbc})}}{R_{l1}*\left[\frac{Re(I_{sfbc})}{Re(\Delta I_{sbc})} - \frac{Im(I_{sfbc})}{Im(\Delta I_{sbc})}\right] - X_{l1}*\left[\frac{Re(I_{sfbc})}{Im(\Delta I_{sbc})} + \frac{Im(I_{sfbc})}{Re(\Delta I_{sbc})}\right]}$$

wherein $V_{Afbc}$ represents a measured phase b to phase c fault voltage; $I_{sfbc}$ represents a phase b to phase c fault current; and $\Delta I_{sbc}$ represents a phase b to phase c superimposed fault current;

(3) for a phase-to-phase fault, $$m = \frac{\frac{Re(V_{Afbc})}{-Im(I_{sf2})} - \frac{Im(V_{Afbc})}{Re(I_{sf2})}}{R_{l1}*\left[\frac{Re(I_{sfbc})}{-Im(I_{sf2})} - \frac{Im(I_{sfbc})}{Re(I_{sf2})}\right] - X_{l1}*\left[\frac{Re(I_{sfbc})}{Re(I_{sf2})} + \frac{Im(I_{sfbc})}{-Im(I_{sf2})}\right]};$$

(4) for a phase-to-phase-to-phase fault, $$m = \frac{\frac{Re(V_{Afa})}{re(\Delta I_{sa})} - \frac{Im(V_{Afa})}{Im(\Delta I_{sa})}}{R_{l1}*\left[\frac{Re(I_{sfa})}{Re(\Delta I_{sa})} - \frac{Im(I_{sfa})}{Im(\Delta I_{sa})}\right] - X_{l1}*\left[\frac{Re(I_{sfa})}{Im(\Delta I_{sa})} + \frac{Im(I_{sfa})}{Re(\Delta I_{sa})}\right]}$$

wherein $I_{sfa}$ represents a phase a fault current; and $\Delta I_{sa}$ represents a phase a superimposed fault current.

21. A system as recited in claim 20, further comprising a circuit breaker, operatively connected to said electric power transmission or distribution system, for remedying the fault after its location has been determined.

22. A system for locating a fault associated with one or more conducators of a multi-phase electric power transmission or distribution system, said fault being one of the following group of fault types: phase-to-ground, phase-to-phase-to-ground, phase-to-phase, and phase-to-phase-to-phase comprising:

(a) means for obtaining a voltage phasor and a current phasor comprising at least one of the following: (i) a protective relay; (ii) voltage and current transformers; (iii) a microprocessor relay; and (iv) an oscillograph, said voltage phasor being indicative of an amplitude and phase associated with a voltage waveform at a first prescribed location and said current phasor being indicative of an amplitude and phase associated with a current waveform at said first prescribed location; and (b) fault locating means, operatively coupled to said means for obtaining a voltage phasor and a current phasor, for generating a fault location parameter m indicative of the location of the fault, said fault locating means being operative to locate a fault on said multi-phase electric power transmission or distribution system, when one occurs, by processing said voltage phasor and current phasor and without considering a voltage phasor or current phasor at another location on said multi-phase electric power transmission or distribution system, and without considering the impedance of a source of said voltage and current phasors.

23. A fault location system comprising:

(a) means for obtaining data representing voltage and current at a fixed location on a transmission line; and (b) means for locating a fault on said transmission line, when one occurs, by processing said data and without considering data representing voltage or current at another location on said line, and without considering the impedance of a source of said voltage and current.

\* \* \* \* \*